United States Patent
Sato et al.

(10) Patent No.: US 6,696,754 B2
(45) Date of Patent: Feb. 24, 2004

(54) SEMICONDUCTOR MODULE INCLUDING A PLURALITY OF SEMICONDUCTOR DEVICES DETACHABLY

(75) Inventors: Mitsutaka Sato, Kawasaki (JP); Tetsuya Fujisawa, Kawasaki (JP); Shigeyuki Maruyama, Kawasaki (JP); Junichi Kasai, Kawasaki (JP); Toshimi Kawahara, Kawasaki (JP); Toshio Hamano, Kawasaki (JP); Yoshihiro Kubota, Kawasaki (JP); Mitsunada Osawa, Ushiku (JP); Yoshiyuki Yoneda, Kawasaki (JP); Kazuto Tsuji, Kawasaki (JP); Hirohisa Matsuki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/214,306

(22) Filed: Aug. 8, 2002

(65) Prior Publication Data

US 2003/0164544 A1 Sep. 4, 2003

Related U.S. Application Data

(62) Division of application No. 09/084,097, filed on May 26, 1998, now Pat. No. 6,472,744.

(30) Foreign Application Priority Data

May 27, 1997 (JP) .............................. 9-136852

(51) Int. Cl.[7] .............................. H01L 23/34

(52) U.S. Cl. ...................................... 257/723; 257/685
(58) Field of Search .............................. 257/723, 724, 257/725, 685, 680

(56) References Cited

U.S. PATENT DOCUMENTS

| 1,376,940 A | 5/1921 | Ives |
| 3,641,401 A | 2/1972 | Lynch ........................ 317/234 |
| 3,702,464 A | 11/1972 | Castrucci .................... 340/173 |
| 3,858,961 A | 1/1975 | Goodman et al. .... 339/176 MP |
| 4,558,912 A | 12/1985 | Coller ........................ 339/64 |
| 4,725,250 A | 2/1988 | Kuhn ........................ 439/629 |
| 4,756,694 A | 7/1988 | Billman ...................... 439/61 |

(List continued on next page.)

FOREIGN PATENT DOCUMENTS

| EP | 0 018 116 | 10/1980 |
| EP | 0 093 659 | 11/1983 |
| EP | 0 121 000 | 10/1984 |
| EP | 0 400 378 | 12/1990 |
| EP | 0 564 955 | 10/1993 |
| JP | 8-51180 | 2/1996 |
| WO | 84-04648 | 11/1984 |

*Primary Examiner*—Roy Potter
(74) *Attorney, Agent, or Firm*—Armstrong, Kratz, Quintos, Hanson & Brooks, LLP

(57) ABSTRACT

A semiconductor module includes a plurality of semiconductor devices each including a circuit substrate carrying thereon a single memory semiconductor chip and a socket for holding the semiconductor devices detachably.

10 Claims, 24 Drawing Sheets

U.S. PATENT DOCUMENTS

| | | | |
|---|---|---|---|
| 4,826,446 A | 5/1989 | Juntwait | 439/326 |
| 4,973,270 A | 11/1990 | Billman | 439/630 |
| 4,992,850 A | 2/1991 | Corbett et al. | 357/72 |
| 5,116,237 A | 5/1992 | Loewen | 439/326 |
| 5,138,434 A | 8/1992 | Wood | 357/74 |
| 5,244,403 A | 9/1993 | Smith | 439/326 |
| 5,254,017 A | 10/1993 | Tondreault | 439/637 |
| 5,259,793 A | 11/1993 | Yamada | 439/637 |
| 5,387,133 A | 2/1995 | Tondreault | 439/637 |
| 5,396,102 A | 3/1995 | Toshio et al. | 257/723 |
| 5,423,691 A | 6/1995 | Pickles | 439/327 |
| 5,443,591 A | 8/1995 | Tsai | 439/342 |
| 5,449,297 A | 9/1995 | Bellomo | 439/630 |
| 5,451,815 A | 9/1995 | Taniguchi | 257/696 |
| 5,580,267 A | 12/1996 | Stipnuk | 439/326 |
| 5,616,044 A | 4/1997 | Tsai | 439/342 |
| 5,626,487 A | 5/1997 | Cheng et al. | 439/326 |
| 5,733,136 A | 3/1998 | Kajiwara | 439/259 |
| 5,746,608 A | 5/1998 | Taylor | 439/70 |
| 5,892,660 A | 4/1999 | Farnworth | 361/728 |
| 5,893,726 A | 4/1999 | Farnworth | 438/108 |
| 5,940,277 A | 8/1999 | Farnworth | 361/760 |
| 5,966,287 A | 10/1999 | Lofland | 361/704 |
| 5,990,566 A * | 11/1999 | Farnworth | 257/783 |
| 6,004,141 A | 12/1999 | Abe | 439/73 |
| 6,008,538 A | 12/1999 | Akram | 257/723 |
| 6,091,606 A | 7/2000 | Farnworth | 361/760 |
| 6,115,260 A | 9/2000 | Nakajima | 361/760 |
| 6,140,700 A | 10/2000 | Shin | 257/730 |
| 6,144,560 A | 11/2000 | Farnworth | 361/760 |

* cited by examiner

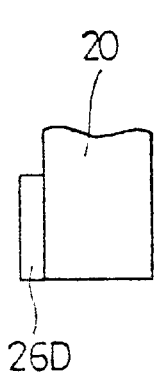
FIG. 7A
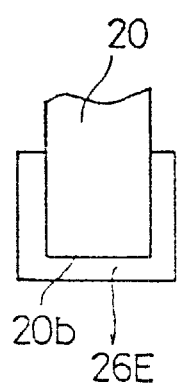
FIG. 7B
FIG. 7C
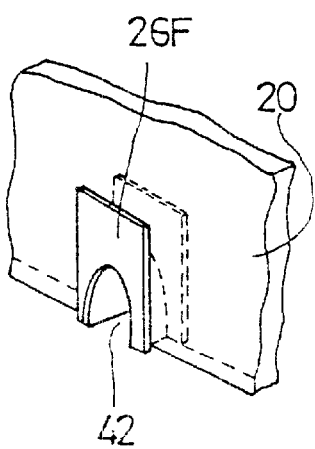
FIG. 7D

FIG. 15
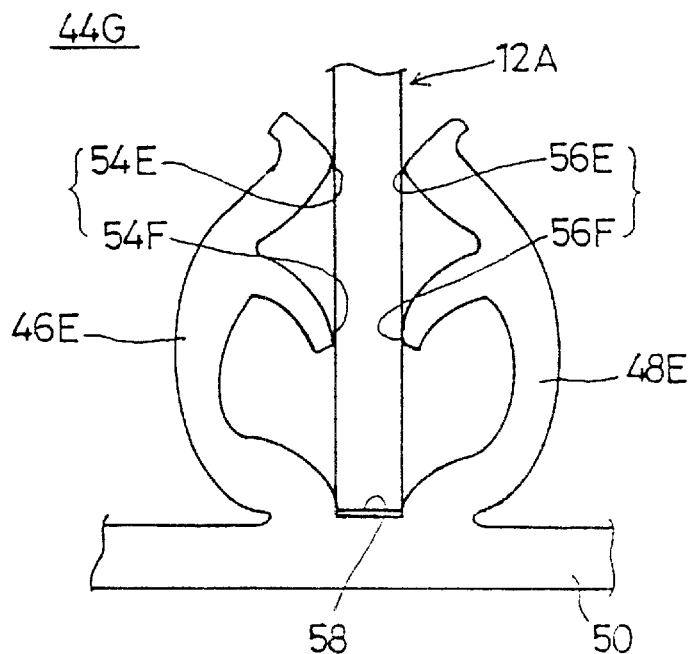
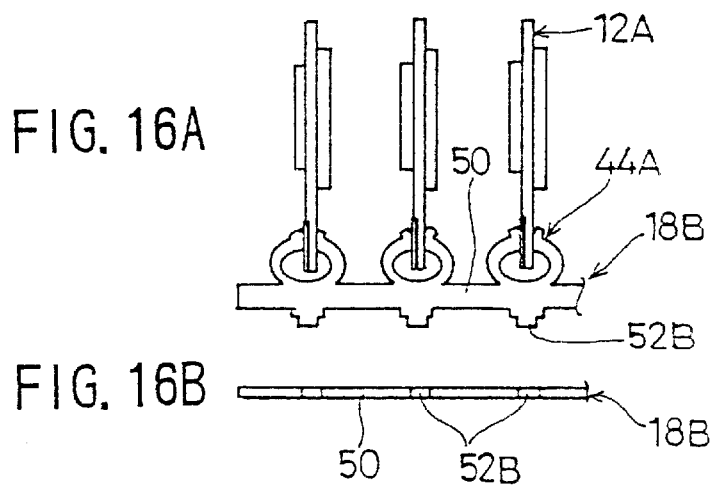
FIG. 16A
FIG. 16B

SEMICONDUCTOR MODULE INCLUDING A PLURALITY OF SEMICONDUCTOR DEVICES DETACHABLY

This application is a divisional of prior application Ser. No. 09/084,097 filed May 26, 1998, now U.S. Pat. No. 6,472,744.

BACKGROUND OF THE INVENTION

The present invention generally relates to semiconductor devices and more particularly to a semiconductor module that includes therein a plurality of semiconductor devices each in turn including a substrate carrying thereon a semiconductor chip. Further, the present invention relates to a semiconductor module assembly including a socket that holds the substrate of the semiconductor device detachably.

Memory semiconductor devices such as DRAMs are used extensively in various information processing apparatuses including personal computers and workstations. In relation to the advancement of such information processing apparatuses, in particular in relation to the advancement of software technology used therein, the storage capacity of the memory semiconductor devices needed in an information processing apparatus is increasing continuously.

In view of the continuous demand of increased memory storage capacity, information processing apparatuses are generally constructed such that the user of the information processing apparatus can upgrade the storage capacity of the memory semiconductor devices as necessary, without discarding the old information processing apparatus.

In the case of personal computers, the upgrading or increase of the memory storage capacity is achieved by adding or replacing a DRAM module called SIMM (single-in-line memory module). In a SIMM module, a plurality of DRAM chips are mounted on a common module substrate that carries a plurality of terminals or contacts on an edge of the module substrate for achieving external interconnection. The SIMM module is thereby mounted on a corresponding socket of a personal computer detachably by engaging the contacts with corresponding contacts of the socket.

Currently the SIMMS having a storage capacity of 16 Mbytes or 32 Mbytes are readily available in the market.

On the other hand, recent progress in the fabrication technology of semiconductor devices has brought a rapid increase in the storage capacity of DRAMs. Thus, it is now possible that a single DRAM chip can have a storage capacity of 32 Mbytes, which has been achieved by a SIMM module that includes a plurality of semiconductor chips. In other words, such a single large capacity DRAM chip can function as a conventional SIMM module.

Generally, a conventional semiconductor chip has been mounted on a mount substrate such as a computer mother board by a soldering process, in which the semiconductor chip and the mount substrate are connected with each other both mechanically and electrically. In the case of CPU chips, on the other hand, it has been practiced to provide a socket on the mount substrate and the CPU chip has been mounted on such a socket in a detachable manner, such that the user of the computer can upgrade the CPU as necessary. As a personal computer uses only one or two CPU chips, such a construction to use a socket for mounting the CPU does not cause a problem in designing the personal computer.

In the case of memory semiconductor devices such as DRAMs that are used in large number in a computer, the mounting structure that uses a socket inevitably increases the size of the mount substrate and hence the size of the computer. Thus, the use of a socket such as the one used for a CPU is not appropriate for the memory semiconductor devices. Because of this reason, the memory semiconductor devices have either been soldered on the mounting substrate of the computer or mounted detachably in the form of a SIMM module.

As noted already, a SIMM module includes a plurality of memory semiconductor devices in the form that semiconductor chips forming the memory semiconductor devices are soldered upon a common module substrate. Thus, a plurality of memory semiconductor chips are mounted simultaneously when a SIMM module is mounted on the mounting substrate of a computer.

When the storage capacity of a memory semiconductor chip has increased as in the case of recent, large capacity memory semiconductor chips, a single memory semiconductor chip can have a storage capacity comparable to that of a conventional SIMM module and can be used in place of such a conventional SIMM module as noted previously. In order to use such a memory semiconductor chip for a conventional SIMM module, it is necessary to provide a mounting structure that enables a detachable mounting of the semiconductor chip on a mounting substrate of a computer. In regard to this demand, it should be noted that conventional memory semiconductor chips have been soldered upon a mount substrate or a module substrate and detachable mounting has not been possible.

Further, in view of expected demand for further storage capacity in future, it is desired that the memory semiconductor chip form a memory module together with similar memory semiconductor chips.

SUMMARY OF THE INVENTION

Accordingly, it is a general object of the present invention to provide a novel and useful semiconductor device and a semiconductor module wherein the foregoing problems are eliminated.

Another and more specific object of the present invention is to provide a semiconductor device that includes a single semiconductor chip on a substrate and constructed so as to be mounted on a socket detachably.

Another object of the present invention is to provide a semiconductor module including one or more semiconductor devices, each including a single semiconductor chip on a substrate, and a socket holding said one or more semiconductor devices in a detachable manner.

Another object of the present invention is to provide a semiconductor device, comprising:
 a substrate carrying a single semiconductor chip thereon;
 an interconnection pattern provided on said substrate in electrical connection with said semiconductor chip; and
 a plurality of contacts provided on an edge of said substrate in electrical connection with said interconnection pattern.

Another object of the present invention is to provide a semiconductor module, comprising:
 a plurality of semiconductor devices each including: a substrate carrying a single semiconductor chip thereon; an interconnection pattern provided on said substrate; and a plurality of contacts provided on an edge of said substrate in electrical connection with said interconnection pattern; and
 a socket holding said plurality of semiconductor devices detachably, said socket engaging said plurality of contacts of said plurality of semiconductor devices detachably.

Another object of the present invention is to provide a socket for holding a plurality of semiconductor devices detachably in an erected state, each of said semiconductor devices carrying a plurality of contacts terminals, said socket including a plurality of socket components provided in correspondence to said plurality of contact terminals on said semiconductor devices, each of said socket components comprising:

a socket main body;

a plurality of contacts provided on said socket main body, said plurality of contacts being adapted for engagement with a plurality of corresponding contact terminals on said plurality of semiconductor devices mechanically, said plurality of contacts on said socket main body establishing an electrical contact with said plurality of corresponding contact terminals of said semiconductor devices and holding said plurality of corresponding contacts of said semiconductor devices detachably; and a plurality of terminals provided on said socket main body in electrical connection with said plurality of contacts on said socket main body.

Another object of the present invention is to provide a semiconductor module, comprising:

a plurality of semiconductor devices each comprising: a substrate carrying a single semiconductor chip thereon; an interconnection pattern provided on said substrate in electrical connection with said semiconductor chip; and a plurality of contacts provided on an edge of said substrate in electrical connection with said interconnection pattern; and a socket for holding said plurality of semiconductor devices detachably, said socket comprising: a socket main body; a plurality of contacts provided on socket main body, said plurality of contacts being adapted for engagement with said plurality of contacts provided on each of said plurality of semiconductor devices mechanically, said plurality of contacts on said socket main body establishing an electrical contact with said corresponding contacts of said plurality of semiconductor devices and holding said contacts of said plurality of semiconductor devices detachably; and a plurality of terminals provided on said socket main body in electrical connection with said contacts on said socket main body.

According to the present invention, it becomes possible to form a semiconductor device including a single semiconductor chip, which may be a memory semiconductor chip, on a substrate such that the semiconductor device is detachable from a socket. By using a semiconductor module that includes such a socket on which one or more of the semiconductor devices are detachably mounted in an information processing apparatus such as a personal computer, the user of the computer can increase or decrease the memory size as necessary by adding or removing the semiconductor devices. The construction of the present invention is particularly effective when a memory semiconductor chip of a very large memory size is used in the semiconductor device.

Other objects and further features of the present invention will become apparent from the following detailed description when read in conjunction with the attached drawings.

BRIEF DESCRIPTION OF THE DRAWINGS

FIGS. 7A–7D are diagrams showing various examples of the contact terminals provided on the semiconductor device used in the present invention;

FIG. 15 is a diagram showing a socket used in a seventh embodiment of the present invention in an enlarged scale;

FIGS. 16A and 16B are diagram showing the construction of a socket according to an eighth embodiment of the present invention;

DETAILED DESCRIPTION OF THE PREFERRED EMBODIMENTS

Figure 1:
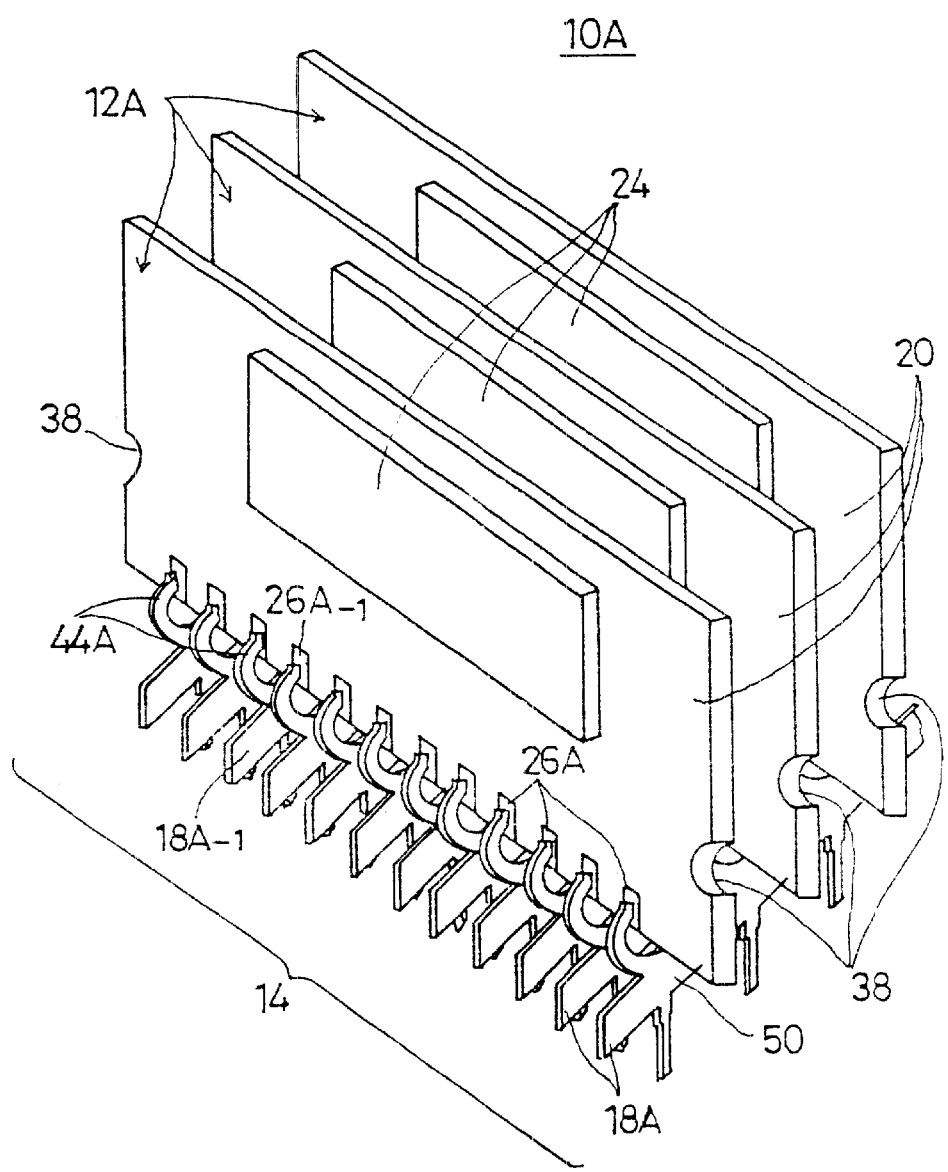
FIG. 1 is a diagram showing the construction of a semiconductor module according to a first embodiment of the present invention.
Figure 2:
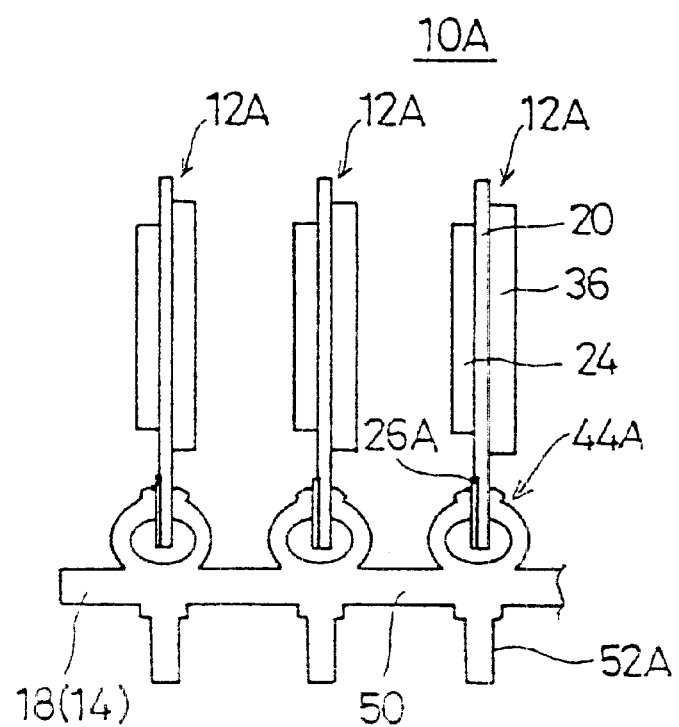
FIG. 2 is a diagram showing the semiconductor module of FIG. 1 in an end view.

FIGS. 1 and 2 are diagrams showing the construction of a semiconductor module 10A according to a first embodiment of the present invention, wherein the semiconductor module 10A is generally formed of a number of semiconductor devices 12A and a mounting socket 14 referred to hereinafter simply as "socket."

Referring to FIGS. 1 and 2, it can be seen that the socket 14 includes a plurality of socket components 18A each carrying a semiconductor device 12A. The semiconductor module 10A is mounted on a mounting substrate of an information processing apparatus such as a mother board of a personal computer not illustrated.

Hereinafter, detailed description will be made on the semiconductor devices 12A and the socket 14 that constitute the semiconductor module 10A.

Figure 3:
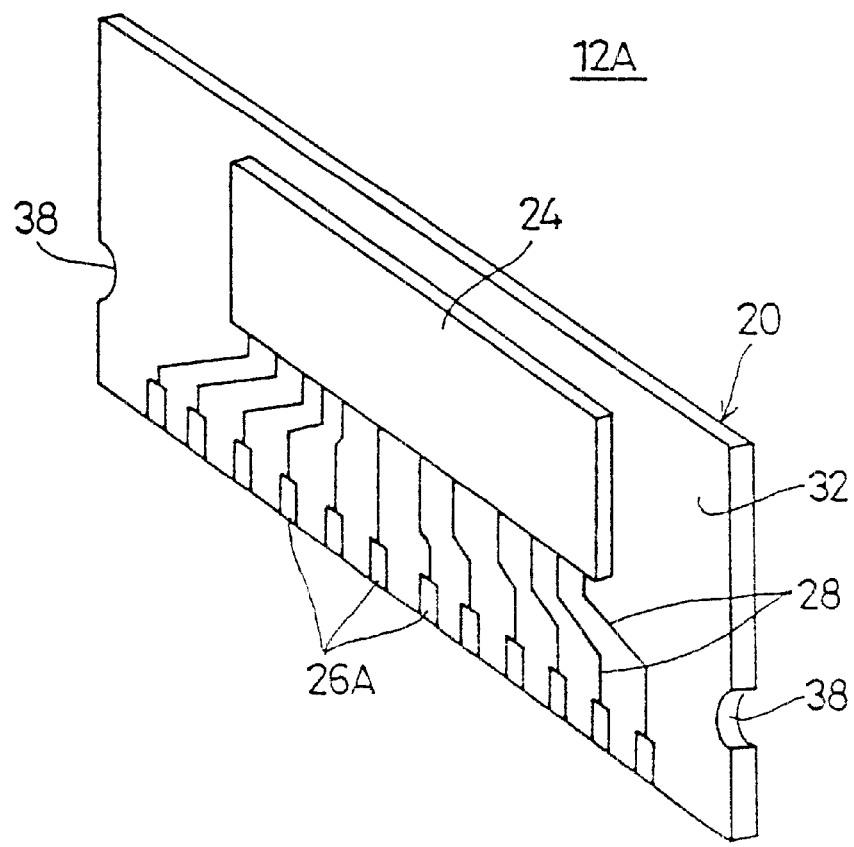
FIG. 3 is a diagram showing the semiconductor module of FIG. 1 in an oblique view.
Figure 4:
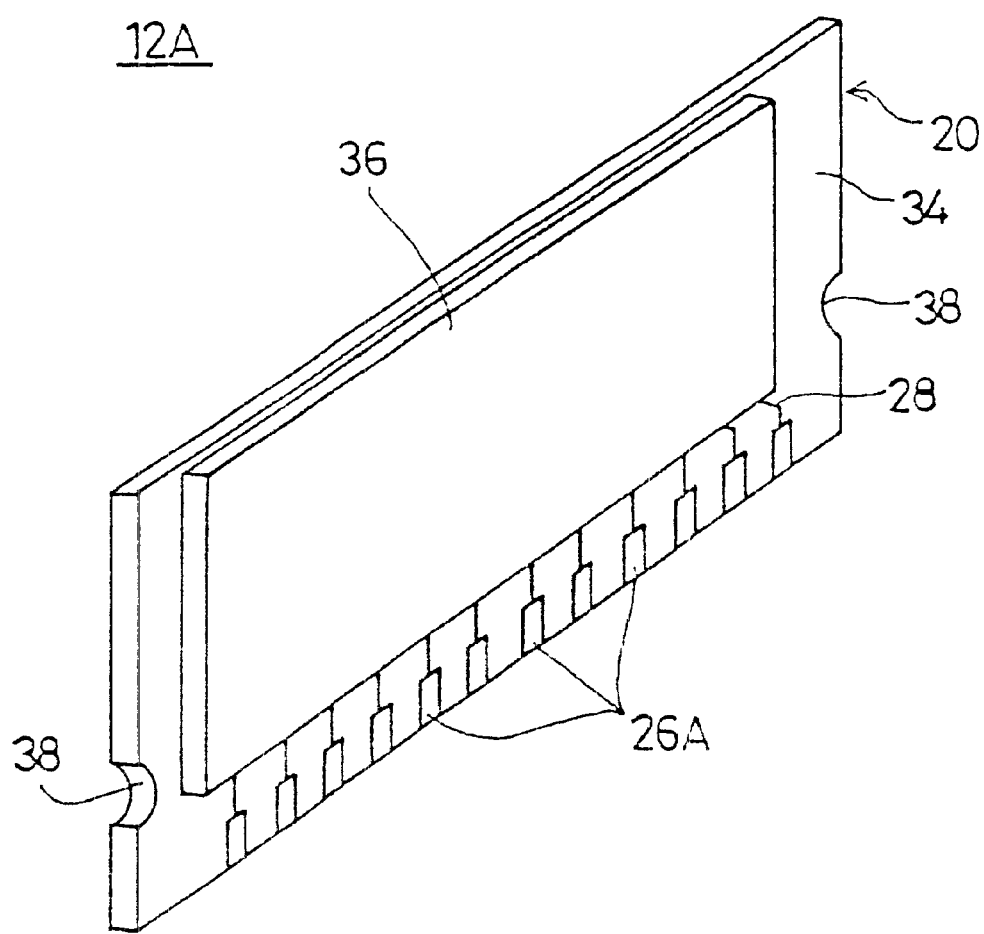
FIG. 4 is a diagram showing the semiconductor module of FIG. 1 from a rear side.
Figure 5A:
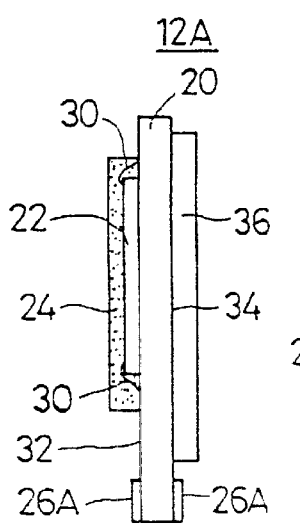
FIG. 5A is a cross-sectional diagram showing the semiconductor device used in the first embodiment.

FIGS. 3, 4 and 5A show a semiconductor device 12A according to a first embodiment of the present invention.

Referring to the drawings, the semiconductor device 12A generally includes a circuit substrate 20, a semiconductor chip 22, a potting resin 24, output terminals 26A, a heat sink 34, and the like, wherein it should be noted that FIG. 3 shows a surface 32 of the circuit substrate 20 on which the semiconductor chip is mounted, while FIG. 4 shows a rear surface 34 opposite to the surface 32.

The circuit substrate 20 may be formed of various materials and may be any of a resin substrate, a ceramic substrate, a glass-epoxy substrate, a flexible substrate, a metal substrate, and the like. In the illustrated example, a glass-epoxy substrate is used for the circuit substrate 20. Further, the circuit substrate 20 may be any of a single-layer substrate or a multiple-layer substrate. In the illustrated example, the circuit substrate 20 uses a multiple-layer construction for improving the degree of freedom of interconnection patterns 28.

It should be noted that the interconnection patterns 28 are provided on the circuit substrate 20 by a well established patterning process on the both surfaces 32 and 34 of the substrate 20. The inner ends of the patterns 28 are connected to the semiconductor chip 22 electrically, while the outer ends of the patterns 28 are connected to respective contact terminals 26A provided on the substrate 20 for external interconnection.

The semiconductor chip 22 is mounted generally at the center of the surface 32 of the circuit substrate 20. The semiconductor chip 22 may thereby be adhered to the substrate 20 by an adhesive. Further, the semiconductor chip 22 and the interconnection patterns 28 are connected with each other by bonding wires 30 by using a well known wire bonding apparatus.

It should be noted that the process for achieving the electrical interconnection between the semiconductor chip 22 and the interconnection patterns 28 is not limited to the wire bonding process but a flip-chip process or TAB (tape automated bonding) process may also be used.

Meanwhile, it should be noted that the semiconductor chip 22 used in the semiconductor device or semiconductor module of the present invention is a memory semiconductor device, particularly a memory semiconductor device having a very large memory size. For example, the memory semiconductor chip 22 may be the one that realizes a memory size of 32 Mbytes by a single chip. Thereby, the semiconductor device that carries such a single semiconductor chip achieves the memory size comparable to that of a conventional semiconductor memory module that includes a number of memory semiconductor chips on a module substrate.

After adhesion to the substrate 20, the semiconductor chip 22 is potted by a potting resin 24, wherein it should be noted that the potting resin 24 protects not only the semiconductor chip 22 alone but also the bonding wires 30.

Further, it should be noted that the contact terminals 26A are formed on an edge of the circuit substrate 20 (bottom edge in the illustrated example) in a row, and the contact terminals 26A thus formed is used for engagement with the socket 14 when the semiconductor device 12A is mounted on the socket 14. Thereby, the semiconductor device 12A is held detachably on the socket 14.

In order to minimize the wear of the contact terminals 26A caused by the friction between the contact terminals 26A and the socket 14, the semiconductor device 12A of the present embodiment covers the surface of the contact terminals 26A by a protective film of Pd or Ni formed by a plating process. Further, the contact terminals 26A thus carrying a protective film are covered by a gold plating for reducing the resistance.

The heat sink 26 may be formed of a conductive metal plate such as Al, wherein the heat sink 26 may be formed to have an area equal to or larger than the area of the semiconductor chip 22. Larger the area of the heat sink 26, larger the efficiency of heat dissipation thereof. The heat sink 26 may be mounted on the rear surface 34 of the circuit substrate 20 by a heat conductive adhesive.

At both lateral sides of the circuit substrate 20, there are provided positioning cutouts 38, wherein the positioning cutouts 38 are formed at the time of cutting or molding of the circuit substrate 20 and are used for a proper positioning of the semiconductor device 12A with respect to the socket 14. By using the positioning cutouts 38, a proper electrical interconnection is achieved between the semiconductor device 12A and the socket 14 even in the case in which the semiconductor device 12A carries a very large number of contact terminals 36A.

As set forth above, the contact terminals 36A are provided on the semiconductor device 12A such that the semiconductor device 12A is detachable from the socket 14. Thus, the present embodiment enables the user of a computer an insertion or removal of the semiconductor device 12A that carries thereon a very large memory size semiconductor chip such as the chip 22, which has a memory size comparable to a conventional memory module, on or from the socket 14 as desired. Thereby, the memory size of the computer can be increased or decreased as desired.

Figure 5B:
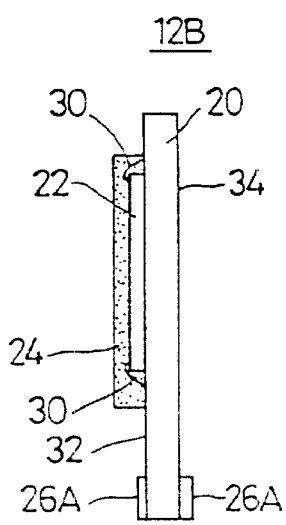
FIGS. 5B and 5C are cross-sectional diagrams showing the semiconductor devices respectively used in second and third embodiments of the present invention.

FIG. 5B shows a semiconductor device 12B according to a second embodiment of the present invention.

Referring to FIG. 5B, the semiconductor device 12B has a construction substantially identical to that of the semiconductor device 12A of the first embodiment, except that the heat sink 36 is removed. When the heating of the semiconductor chip 22 is small, the heat sink 36 may be removed without problem.

Figure 5C:
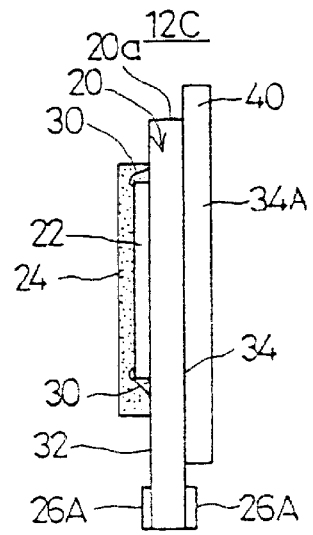

FIG. 5C shows a semiconductor device 12C according to a fourth embodiment of the present invention.

Referring to FIG. 5C, the semiconductor device 12C carries a heat sink 34A in place of the heat sink 36 of the first embodiment, except that top part of the heat sink 34A extends beyond a top edge 20a of the circuit substrate 20 to form an extension part 40. By forming such an extension part 40 in the heat sink 34A, it should be noted that the extension part 40 can be used as a guide for a proper positioning of the semiconductor device 12C on the socket 14, and the precision of alignment of the semiconductor device 12C on the socket 14 is improved substantially. Further, the efficiency of heat dissipation may be improved further, by connecting another heat dissipation mechanism to the extension part 40 as will be explained later with reference to FIG. 31.

It should be noted that the location of the extension part 40 is by no means limited to the top edge 20a of the circuit substrate 20 but the extension part 40 may be provided on any edge except for the bottom edge on which the contact terminals 26A are formed.

Figure 6:
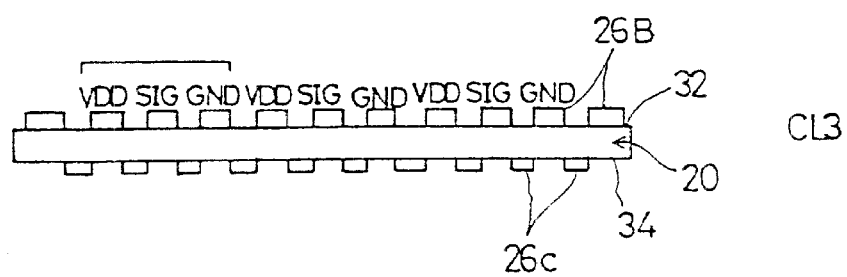
FIG. 6 is a diagram showing the construction of a semiconductor device used in a fourth embodiment of the present invention in a bottom view.

FIG. 6 shows the construction of a semiconductor device 12D according to a fourth embodiment of the present invention in a bottom view, showing contact terminals 26B and 26C used in the present embodiment.

Referring to FIG. 6, the contact terminals 26B and 26C are formed at respective, mutually opposite surfaces of the circuit substrate 20 with a substantially identical pitch, wherein the contact terminals 26B are displaced collectively with respect to the contact terminals 26C by one-half pitch. By providing the contact terminals on both sides of the circuit substrate 20, it is possible to reduce the pitch of the contact terminals to one-half as compared with the case in which all the terminals are provided on one side of the circuit substrate 20. Thereby, the density of the contact terminals is increased by twice on the circuit substrate 20.

In the illustrated example, the contact terminals 26B and 26C includes power terminals (VDD), ground terminals (GND) and signal terminals (SIG), wherein the signal terminals are disposed such that each signal terminal is laterally sandwiched by a power terminal and a ground terminal. By doing so, the signal terminal is effectively shielded from external noise.

FIGS. 7A–7D show various examples of the contact terminals in the cross-sectional view of the substrate 20, wherein it should be noted that FIG. 7A represents the structure explained in the previous embodiments in which the contact terminals 26A are disposed at both sides 32 and 34 of the circuit substrate 20.

On the other hand, FIG. 7B shows another example in which a contact terminal 36D is provided only on the surface of the circuit substrate 20 on which the semiconductor chip 22 is mounted. The construction of FIG. 7B is economical in view of the reduced number of the contact terminals and is effective in the case in which the total number of the contact terminals necessary on the circuit substrate 20 is relatively small.

FIG. 7C shows a further example in which the circuit substrate 20 carries a contact terminal 26E such that the contact terminal 26E covers not only the surfaces 32 and 34 of the substrate 20 but also a bottom edge 20b thereof. Further, FIG. 7D shows an example having a pocket or depression 42 formed on the bottom edge 20b of the circuit substrate 20 and a contact terminal 26F is formed such that the contact terminal 26F covers the pocket 42.

Figure 25A:
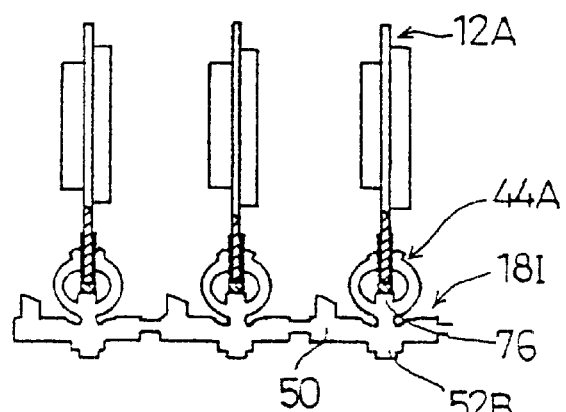
FIGS. 25A and 25B are diagrams showing the construction of a socket according to a fourteenth embodiment of the present invention.
Figure 25B:
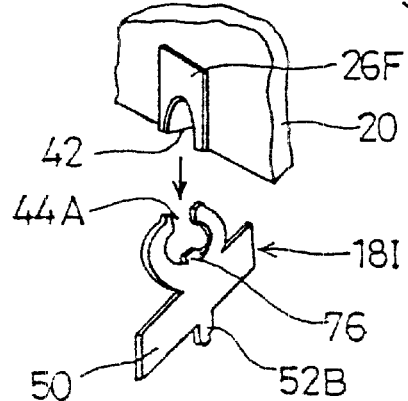

In the construction of FIG. 7C, it should be noted that the contact area of the contact terminal 26F and the socket 14 can be increased as indicated in FIGS. 25A and 25B, wherein it should be noted that the socket of FIGS. 25A and 25B includes a socket component 18I having a projection 76. As indicated in FIG. 25A, the projection 76 engages the contact terminal 26F in correspondence to the part where the pocket 42 is formed and the contact area is increased as a result of the contact of the projection 76 with the contact terminal 26F. Further, the construction of FIG. 7C is advantageous in the point that the pocket 42 can be used for an accurate positioning the semiconductor device with respect to the socket.

Hereinafter, description will be made on the socket 14.

Figure 8:
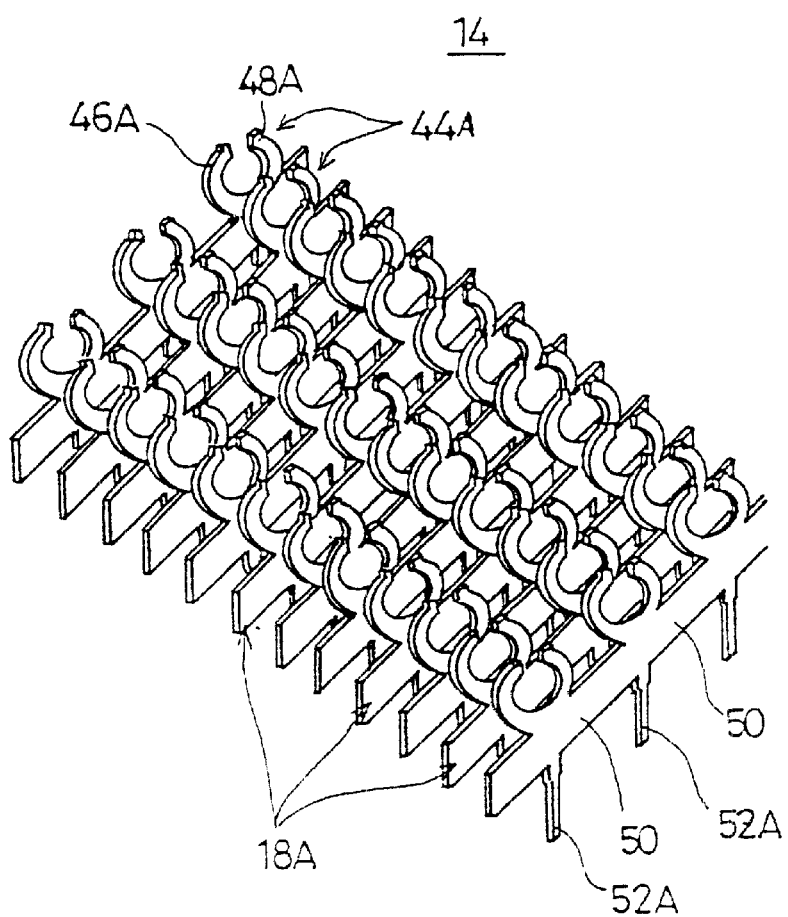
FIG. 8 is a diagram showing the construction of a socket used in the first embodiment of the present invention.
Figure 9:
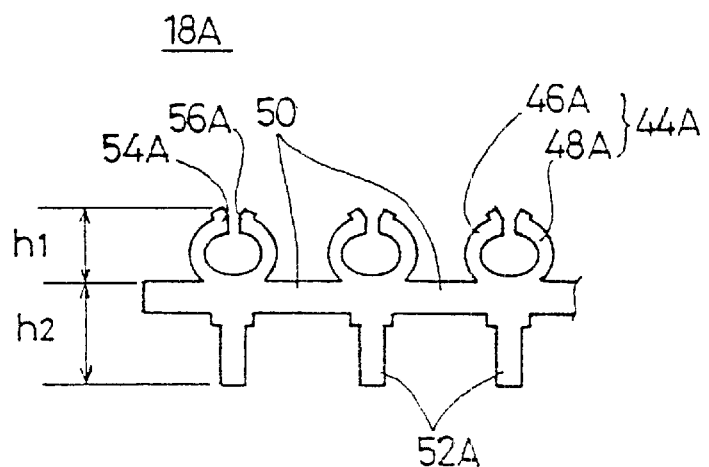
FIG. 9 is a diagram showing the socket of FIG. 8 in a side view.

FIGS. 8 and 9 show the socket 14 used in the first embodiment of the present invention.

Referring to FIGS. 8 and 9, it should be noted that the socket 14 is formed of a conductor material used for lead frames such as a copper alloy and includes a plurality of socket components 18A provided with a number corresponding to the number of the contact terminals 26A provided on the semiconductor device 12A. In the illustrated example of FIG. 8, there are twelve such socket components 18A disposed parallel with each other in correspondence to the twelve contact terminals 26A that are provided on the semiconductor device 12 explained with reference to FIGS. 3 and 4.

Generally, a socket component 18A includes an interconnection part 44A, a main body 50 and a terminal 52A wherein the interconnection part 44A and the terminal 52A are formed integrally to the main body 50. The interconnection part 44A in turn includes a first contact member 46A and a second contact member 48A each having a C-shaped form, while the first and second contact members 46A and 48A carry contact points 54A and 56A at respective tip ends thereof.

It should be noted that the contact members 46A and 46B are formed such that there exists a gap between the contact point 54A and the contact point 56A, wherein the gap has a size slightly smaller than the thickness of the circuit substrate 20. The contact members 46A and 46B are provided such that the contact points 54A and 56A are located in correspondence to the contact terminals 26A of the semiconductor device 12A.

Thus, the contact terminals 26A of the semiconductor device 12A are held by the interconnection parts 44A of the socket components 18A when the semiconductor device 12A is mounted upon the socket 14 formed of the socket components 18A. Thereby, the contact points 54A and 56A on the contact members 46A and 48A achieve an electrical connection with the corresponding contact terminals 26A, and the semiconductor device 12A is connected not only mechanically but also electrically to the socket 14.

As indicated in FIG. 9, it should be noted that the contact points 54A and 56A defining therebetween a gap for accepting the circuit substrate 20 of the semiconductor device 12A are formed generally at the top central part of the interconnection part 44A. Thus, the socket 14 holds each of the semiconductor devices 12A vertically with an increased mounting density.

It should be noted that the main body 50 of the socket component 18A connects the interconnection parts 44A mechanically as well as electrically, wherein the main body 50 extends in a direction generally perpendicular to the plane of the circuit substrate 20 in the state that the semiconductor devices 12A are mounted on the socket 14.

Further, it can be seen that the terminals 52A extend in the downward direction from the main body 50, wherein the terminals 52A are adapted for electrical as well as mechanical interconnection with a mounting substrate such as the mother board of a computer. Thus, by mounting the semiconductor device 12A on the socket 14, the semiconductor device 12A is connected electrically to the mounting substrate via the contact points 54A and 56A, the contact members 44A and 46A, the main body 50 and the terminal 52A.

Hereinafter, the property of the contact terminals 26A on the semiconductor device 12A will be described.

As noted previously, the contact terminals 26A of a semiconductor device 12A generally includes a power terminal (VDD), a ground terminal (GND) and signal terminals (SIG). When the semiconductor device is a memory semiconductor device, it is practiced to connect with each other the terminals of the same property when a number of the semiconductor devices are mounted on a mount substrate.

Thus, in the construction of FIG. 1, a power terminal $26A_{-1}$ of the semiconductor device 12A is connected to corresponding power terminals of other semiconductor devices 12A provided at the same location by a single socket component $18A_{-1}$, and the power supply is achieved to each of the semiconductor devices 12A via the socket component $18A_{-1}$ simultaneously. A similar construction is used also for the ground terminals (GND) and signal terminals (SIG). By using a common socket component 18A for holding a plurality of semiconductor devices 12A as in the semiconductor module 10A of FIG. 1, the wiring on the mount substrate is substantially simplified.

As indicated in FIG. 1, the semiconductor module 10A includes the socket components 18A such that each of the socket components 18A extends perpendicularly to the plane of the circuit substrate 20, and each of the socket components 18A connects the semiconductor devices 12A such that the contact terminals 26A of the same property are connected with each other.

Of course, not all the contact terminals 26A of the semiconductor devices 12A are to be connected with each other. For example, the contact terminals 26A aligned along the bottom edge of a semiconductor device 12A cannot be and should not be connected with each other. The construction of the socket 14 for holding the socket components 18A with each other without electrical interconnection will be described later with referent to other embodiments.

In the socket 14 of the present embodiment, the interconnection parts 44A forming a part of the socket component 18A hold the semiconductor device 12A, which is a large memory size memory semiconductor device as noted before, detachably. By using the socket 14 on a mother board of a computer, it becomes possible to increase or decrease the memory size of the computer as necessary.

As the first and second contact members 46A and 48A have a C-shaped form as noted already, the interconnection part 44A can not only achieve an electrical interconnection but also a mechanical support of the semiconductor device 12A. In other words, the mechanical support and electrical interconnection of the semiconductor device 12A are achieved by a very simple construction by using the socket 14.

It should be noted that the interconnection part 44A has a height $h_1$ as measured from the top edge of the main body 50 while the terminal 52A projects in the downward direction from the bottom edge of the main body 50 with an amount $h_2$ as indicated in FIG. 9, wherein it should be noted that the projection $h_1$ of the interconnection part 44A is set as small as possible within a constraint that the interconnection part 44A can support the semiconductor device 12A stably. By minimizing the height $h_1$ of the interconnection part 44A, the resistance associated with the interconnection part 44A is also minimized.

As the interconnection part 44A, the main body 50 and the terminal 52A forming a socket component 18A are formed of the same material integrally, the socket component 18A can be produced easily by a press forming process.

In view of the mode of use of the socket 14 in which the semiconductor device 12A is inserted to or removed from the socket 14, it is advantageous to provide a protective film of Pd or Ni on the socket component 18A, typically by a plating process, such that the friction wear of the interconnection part 44A is minimized.

As long as there is a sufficient gap between the contact points 54A and 56A on the first and second contact members 46A and 48A, such a protective film can be formed easily and reliably by a conventional electroplating process. On the other hand, such an increase of the gap between the contact points 54A and 56A is disadvantageous in view of the reduced urging force of the contact members 46A and 48A for holding the semiconductor device 12A resiliently.

Figure 10:
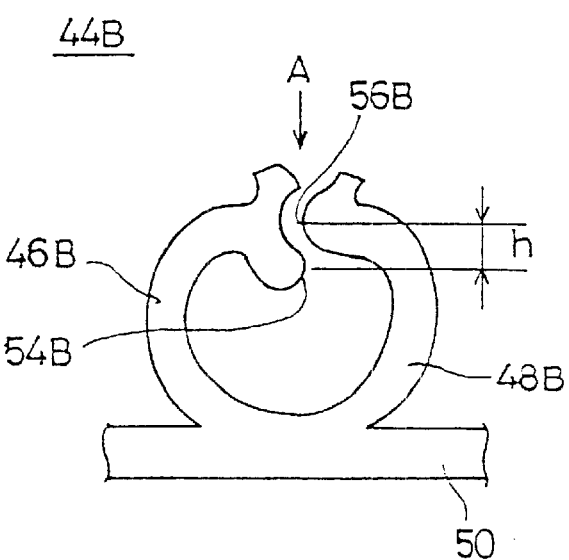
FIG. 10 is a diagram showing a socket used in the second embodiment of the present invention in an enlarged scale.
Figure 11:
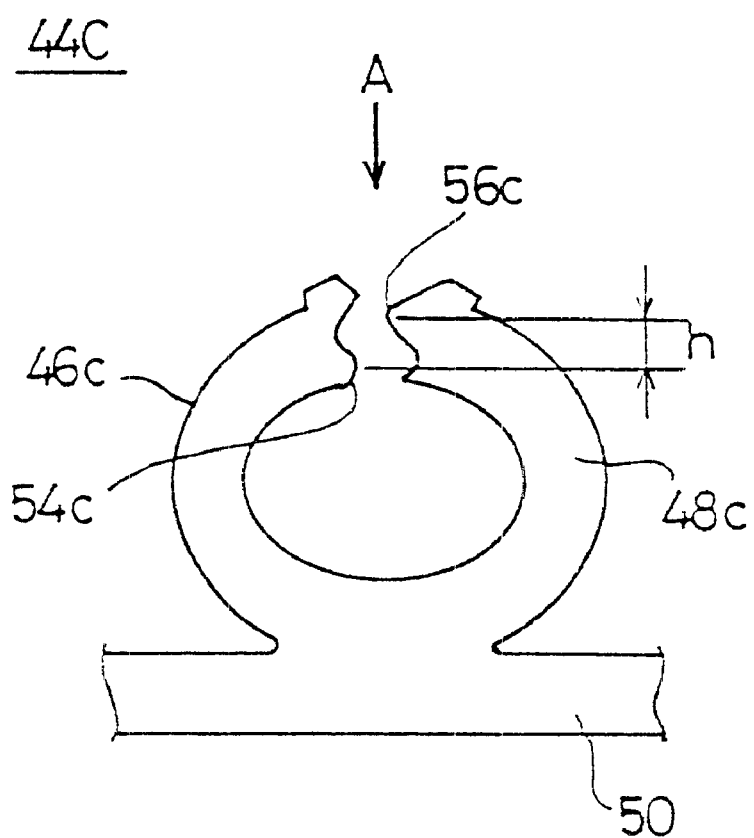
FIG. 11 is a diagram showing a socket used in the third embodiment of the present invention in an enlarged scale.
Figure 12:
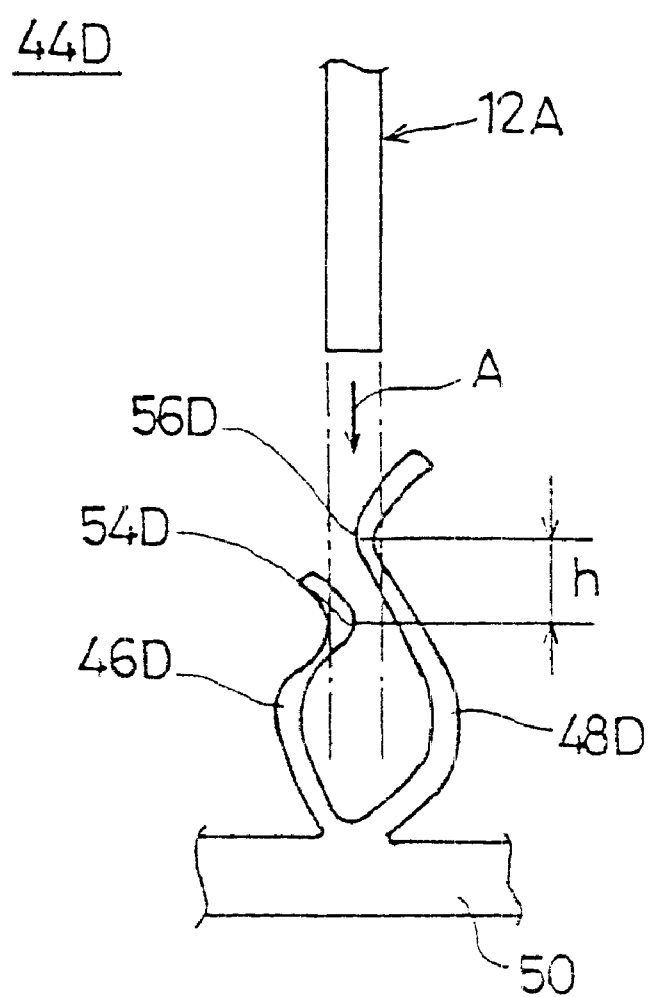
FIG. 12 is a diagram showing a socket used in the fourth embodiment of the present invention in an enlarged scale.

FIGS. 10–12 respectively show interconnection parts 44B–44D used in the socket according to second through fourth embodiments of the present invention.

Referring to FIGS. 10–12, the interconnection parts 44B–44D include first contact members 46B–46D and corresponding second contact members 48B–48D respectively, wherein the first contact members 46B–46D carry thereon contact points 54B–54D while the second contact members 48B–48D carry thereon contact points 56B–56D respectively.

As indicated in FIGS. 10–12, each of the contact members 46B–46D has a projection for engagement with the contact terminal 26A of the semiconductor device 12A mounted on the socket 14 in correspondence to a contact point such as the contact point 54B, while each of the contact members 48B–48D has a projection in correspondence to a contact point such as the contact point 56B, also for engagement with the contact terminal 26A of the semiconductor device 12A from the rear side thereof. It should be noted thereby that the projection on the contact member such as the projection 54B of the contact member 46B is displaced in a vertical direction with respect a corresponding projection such as the projection 56B of the contact member 48B by a distance h.

In the embodiment of FIG. 10, the projections 54B and 56B project toward the gap between the contact members 46B and 48B and the gap thus formed has a C-shaped form. Similarly, the projections 54C and 56C project toward the gap in the embodiment of FIG. 11 and the gap thus formed takes an S-shaped form. Further, the embodiment of FIG. 12 uses a pair of twisted pins for the contact members 46D and 48D wherein the pins 46D and 48D are twisted to have a generally C-shaped form.

According to any of the foregoing second through fourth embodiment of the present invention, the gap between the first contact member such as the contact member 46B and the second contact member such as the contact member 48B can be increased successfully without sacrificing the urging force of the contact members 46B and 48B used for holding the semiconductor device 12A firmly. In relation to this, it should be noted that the contact point 54B on the contact member 46B and the contact point 56B on the contact member 48B overlap substantially when viewed in the direction indicated in FIG. 10 by an arrow A. A similar relationship holds also in the embodiments of FIGS. 11 and 12.

As the gap between the contact points is increased in the present embodiments, the wear-resistant coating can be made effectively on the first and second contact members 46B–46D and 48B–48D by an electroplating process or other suitable deposition process. Further, the embodiments of FIGS. 10–12 are advantageous in the point that, due to the increased gap between the first and second contact members 46B–46D and 48B–48D, the mold used for press-forming of the first and second contact members 46B–46D and 48B–48D is formed easily. Thereby, the cost of the socket 14 and hence the semiconductor module 10A is reduced effectively.

In the embodiments described heretofore, it should be noted that the semiconductor device 12A is held on the socket 14 solely by the resilient urging of the first and second contact members 46A–46D and 48A–48D, while such a construction is vulnerable to the problem of tilting of the semiconductor device 12A and the semiconductor device 12A may be tilted easily when an external force is applied.

Thus, the construction addressing the foregoing problem will be described hereinafter with reference to FIGS. 14–15 respectively showing interconnection parts 44E–44G according to fifth through seventh embodiments of the present invention in an enlarged scale.

Figure 13:
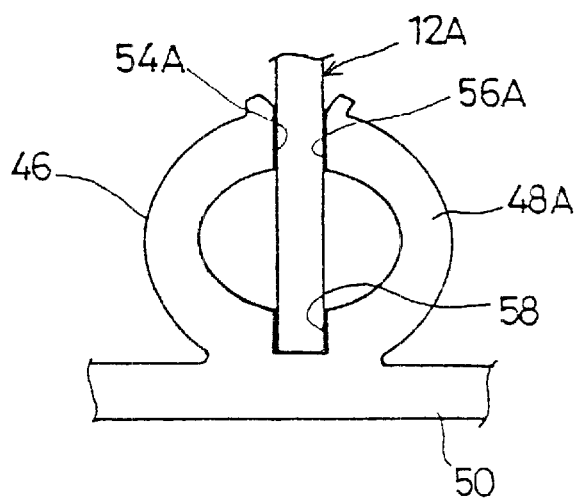
FIG. 13 is a diagram showing a socket used in a fifth embodiment of the present invention in an enlarged scale.

Referring to FIG. 13 showing the interconnection part 44E according to the fifth embodiment, it can be seen that there is formed a depression 58 between the first contact member 46A and the second contact member 48A for accepting the bottom edge of the semiconductor device 12A. According to the present embodiment, the semiconductor device 12A is held not only by the resilient urging force of the contact members 46A and 48A but also by the depression 58, and the semiconductor device 12A is held stably on the socket 14.

Figure 14:
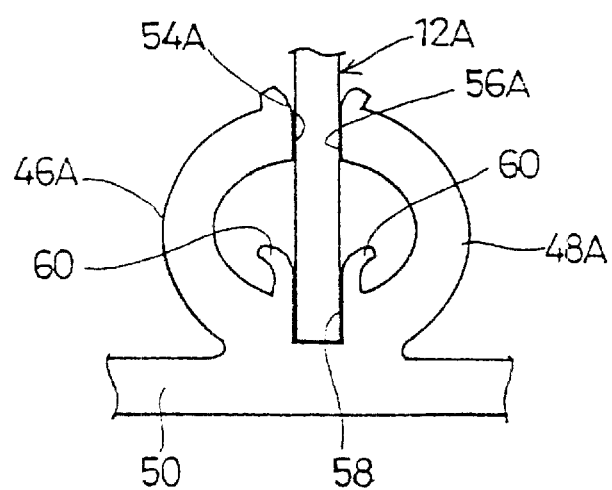
FIG. 14 is a diagram showing a socket used in a sixth embodiment of the present invention in an enlarged scale.

FIG. 14 shows the interconnection part 44F of the sixth embodiment, wherein it can be seen that the interconnection part 44F includes, in addition to the construction of the interconnection part 44E of the previous embodiment, a guide 60 for guiding the insertion of the semiconductor device 12A into the depression 58. It should be noted that the guide 60 is formed in continuation to the depression 58 and defines a guide slot in which the bottom edge of the circuit substrate 20 of the semiconductor device 12A is accepted.

In the seventh embodiment of FIG. 15, the interconnection part 44G includes a first contact member 46E and a second contact member 48E each including a plurality of contact points such that the first contact member 46E includes a first contact point 54E a second contact point 54F while the second contact member 48E includes a first contact point 56E and a second contact point 56F. As can be seen in FIG. 15, the first and second contact points 54E and 54F support the semiconductor device 12A from a first side thereof while the third and fourth contact points 56E and 56F support the semiconductor device 12B from a second, opposite side of the semiconductor device 12, wherein it should be noted that the first and second contact pints 54E and 54F and the third and fourth contact points 56E and 56F make a contact engagement with the contact terminal 26A of the semiconductor device 12A not shown in FIG. 15. Further, the first and second contact members 46E and 48E form therebetween a depression that holds the bottom edge of the semiconductor device 12A.

As the first and second contact points 54E and 54F are formed at respective, different heights as measured from the top surface of the main body 50, and as the third and fourth contact points 56E and 56F are formed at respective different heights as measured from the top surface of the main body 50, the semiconductor device 12A device is held stably on the socket 14 and a reliable electrical contact is guaranteed.

Next, a description will be made on socket components 18B–18D according to eighth through tenth embodiments of the present invention with reference to FIGS. 16A and 16B through FIGS. 18A and 18B, wherein it should be noted that the socket components 18B–18D have terminals 52B–52D for mounting on a mount substrate.

Referring to FIGS. 16A and 16B showing the socket component 18B of the eighth embodiment of the present invention respectively in an end view and a bottom view, the socket component 18B is adapted for surface mounting on a mount substrate not shown and the terminal 52B is formed to have a characteristically short length suitable for such a surface mounting.

Figure 17A:
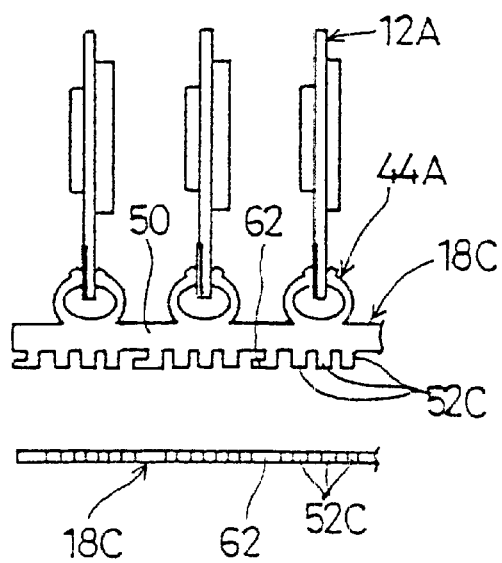
FIGS. 17A and 17B are diagrams showing the construction of a socket according to a ninth embodiment of the present invention.
Figure 17B:
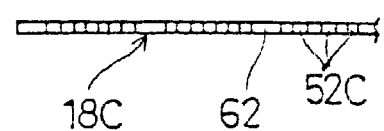

In the socket component 18C of the ninth embodiment of the present invention shown in FIGS. 17A and 17B, on the other hand, a support terminal 62 is provided at the bottom of the maim body 50 such that the support terminal 62 divides the terminals 52C, provided on the main body 50 in correspondence to the terminals 52A, into a plurality of groups. It should be noted that FIG. 17A shows the end view while FIG. 17B shows a bottom view. The support terminal 62 has an L-shaped form for improved mechanical strength, and the terminals 52C on the main body 50 are successfully protected when the socket including the socket component 18C is mounted on a mount substrate such as the mother board of a computer by a surface mounting technology. Thereby, a reliable contact to the mother board is guaranteed for the terminals 52C.

Figure 18A:
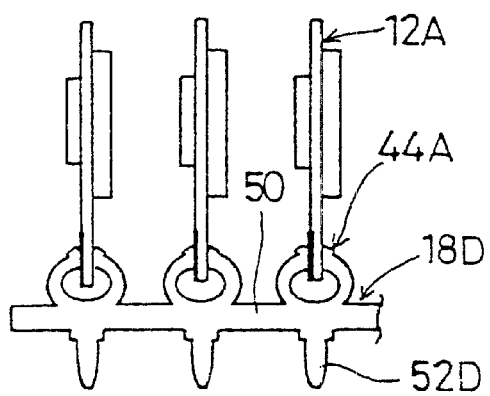
FIGS. 18A and 18B are diagrams showing the construction of a socket according to a tenth embodiment of the present invention.
Figure 18B:
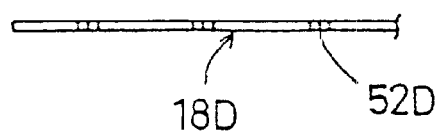

In the socket component 18D of the tenth embodiment, on the other hand, the socket component 18D is provided with terminals 52D suitable for insertion mounting, wherein it should be noted that the terminals 52D have a sword-like shape as indicated in FIGS. 18A and 18B. Similarly as before, FIG. 18A shows en end view while FIG. 18B shows a bottom view.

Figure 19A:
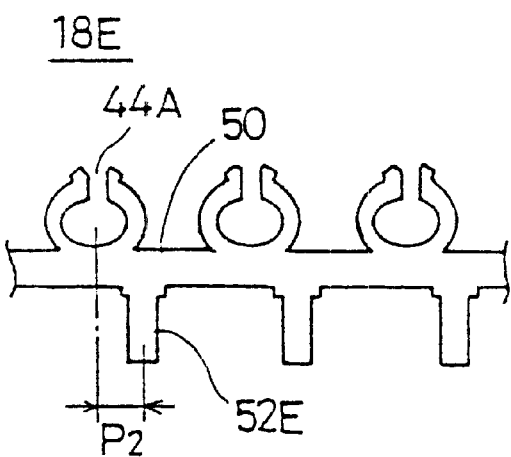
FIGS. 19A–19C are diagrams showing the construction of a socket according to an eleventh embodiment of the present invention.
Figure 19B:
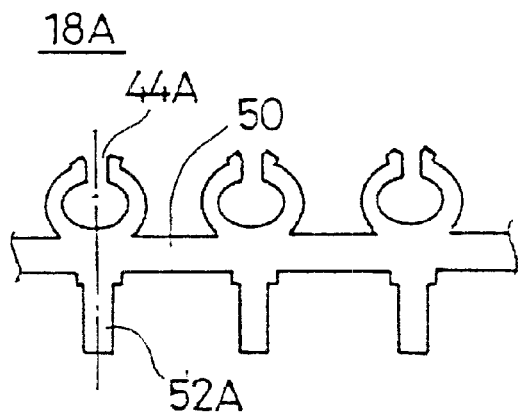
Figure 19C:
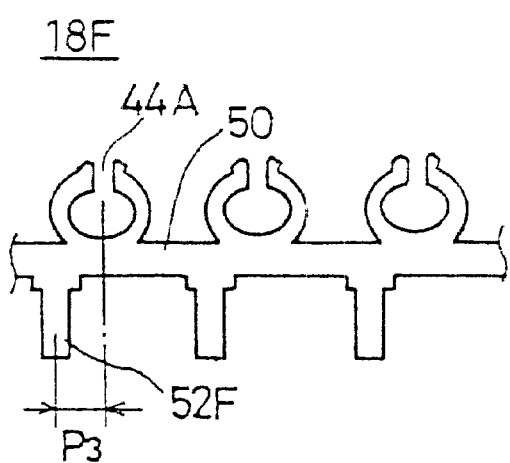
Figure 20:
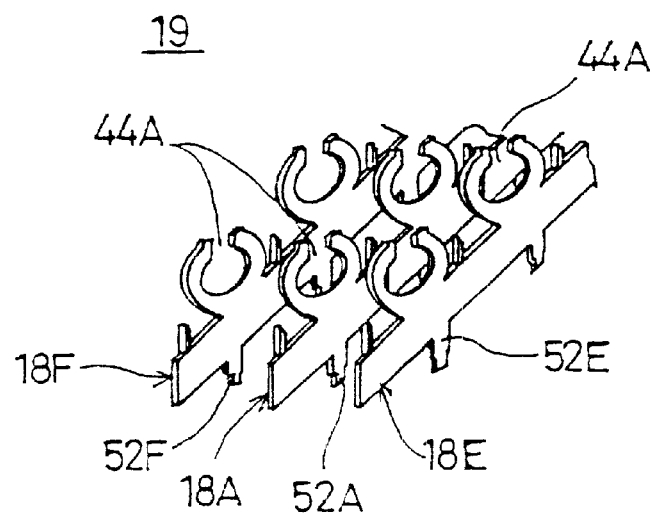
FIG. 20 is another diagram showing the socket of the eleventh embodiment.

Next, a socket according to an eleventh embodiment of the present invention will be described with reference to FIGS. 19A–19C and further with reference to FIG. 20, wherein FIGS. 19A and 19C show various modification of the socket component 18A described previously and shown in FIG. 19B, while FIG. 20 shows the overall view of a socket 19 of the eleventh embodiment that uses the socket component of FIG. 19A or FIG. 19C.

Referring to FIG. 19A showing a socket component 18E, the socket component 18E has terminals 52E on the main body 50 in correspondence to the terminals 52A of the socket component 18A shown in FIG. 9 and also in FIG. 19B except that the terminals 52E are collectively displaced with respect to the interconnection part 44A in a first direction (to the right in the illustrated example) by a distance $P_2$. In the case of FIG. 19C showing a socket component 18F according to a modification of the socket component 18E of FIG. 19A, on the other hand, it should be noted that the socket component 18F carries terminals 52F displaced with respect to the interconnection part 44A in the second, opposite direction (to the left in the illustrated example) by a distance $P_3$.

Further, FIG. 20 shows the construction of a socket 19 in which the socket components 18F, 18A and 18E are used. By repeating the socket components 18F, 18A and 18E with this order as indicated in FIG. 20, there appears a lattice pattern of the terminals 52A, 52E and 52F for the socket 19 in the bottom view. Thereby, the pitch of the interconnection patterns provided on the mother board for connection to the terminals 52A, 52E and 52F can be increased while maximizing the mounting density of the semiconductor devices 12A.

Next, a socket according to a twelfth embodiment of the present invention will be described with reference to FIGS. 21 and 22.

Figure 21:
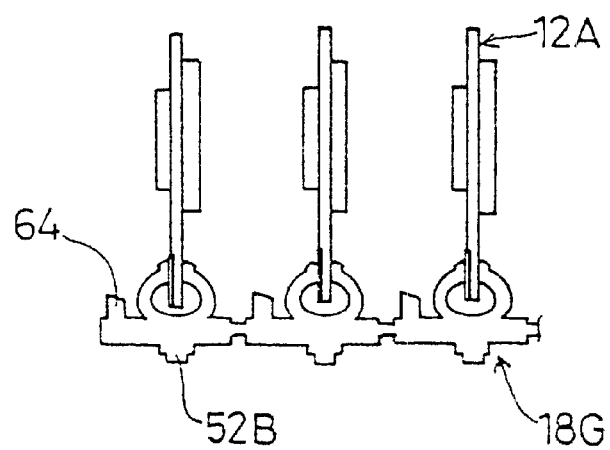
FIG. 21 is a diagram showing the construction of a socket according to a twelfth embodiment of the present invention.
Figure 22:
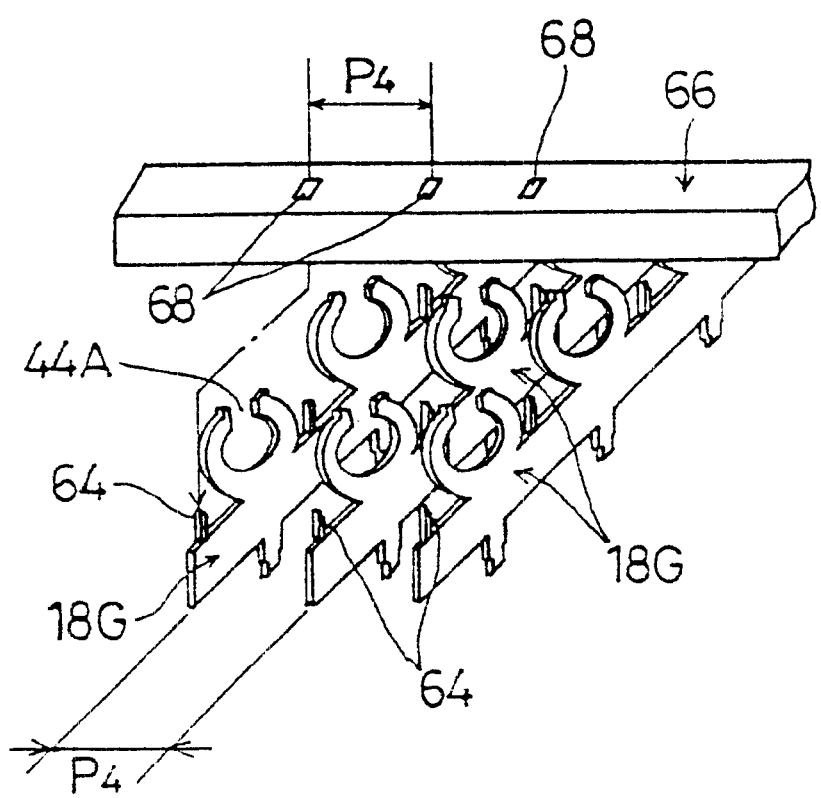
FIG. 22 is another diagram showing the socket of the twelfth embodiment of the present invention.

Referring to FIGS. 21 and 22 showing a socket component 18G, it should be noted that the socket component 18G carries a positioning projection 64 that is used for aligning the socket component 18G with other similar socket components 18G by a frame member 66 to form a socket as indicated in FIG. 22. In the socket of FIG. 22, it should be noted that each of the socket components 18G has to achieve a contact with a corresponding contact terminal 26A on the semiconductor device 12A mounted on the socket, while such a contact is achieved only when the socket components 18G are repeated with a proper pitch $P_4$ corresponding to the pitch of the contact terminals 26A on the semiconductor device 12A.

In the present embodiment, the foregoing pitch $P_4$ of the socket components 18G is achieved easily and precisely by interconnecting the socket components 18G by the frame member 66 such that the positioning projections 64 of the socket components 18G engage with corresponding positioning apertures 68 on the frame member 66.

It should be noted that the positioning projection 64 on the socket component 18G can be formed easily by a press forming process together with the remaining part of the socket component 18G. Further, the frame member 66 is formed of an insulating material such as a resin or a metal provided with an insulating coating and is formed with the positioning apertures 68 with a high precision.

The socket of FIG. 22 is thereby easily assembled by approximately aligning the socket components 18G and mounting the frame member 66 on such approximately aligned socket components 18G. As a result of use of the frame member 66, a reliable electrical interconnection is achieved between each of the socket components 18G and the corresponding contact terminal 26A on the semiconductor device 12A.

Figure 23:
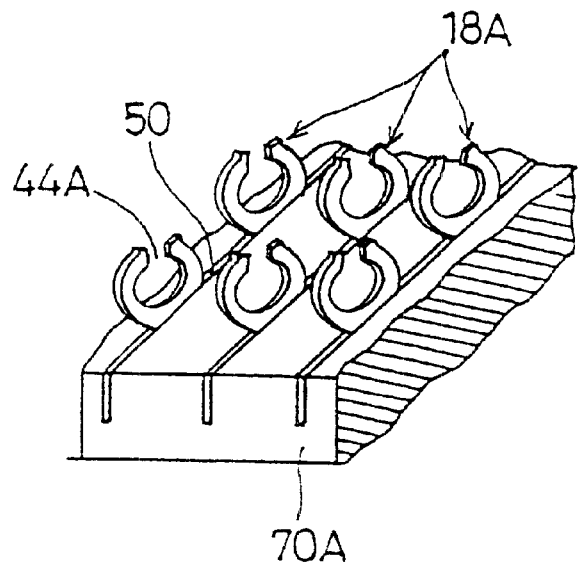
FIG. 23 is a diagram showing the construction of a socket according to a thirteenth embodiment of the present invention.
Figure 24:
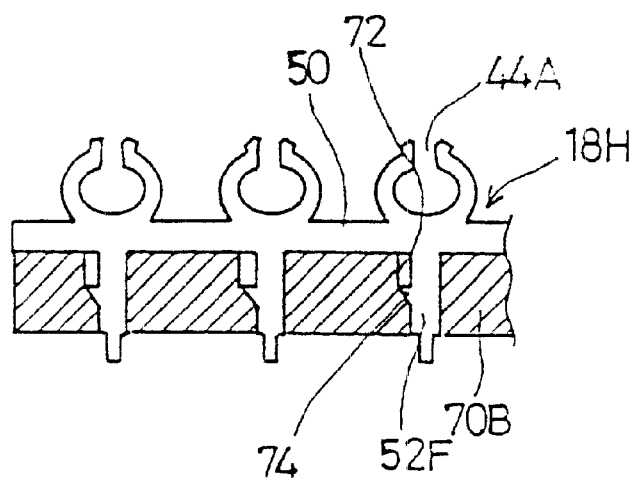
FIG. 24 is another diagram showing the socket of the thirteenth embodiment.

FIGS. 23 and 24 show the construction of a socket according to a thirteenth embodiment of the present invention.

Referring to FIG. 23, the socket of the present embodiment uses a positioning member 70A for aligning the socket components 18A, wherein it should be noted that the embodiment of FIG. 23 employs a resin block for the positioning member 70A. More specifically, the resin block 70A holds the socket components 18A therein in the state that the socket components 18A are embedded in the resin block 70A, wherein the structure of FIG. 23 is formed by holding the socket components 18A in a properly aligned state in a mold by using a jig, and pouring a molten resin into the mold such that the molten resin buries the socket components 18A therein. It should be noted that the mold used for forming the resin block 70A may have the function of the jig for holding the socket components 18A in the properly aligned state.

In the embodiment of FIG. 24, a number of socket components 18H each having a construction similar to that of the socket component 18A, except for a click 74 to be described, are inserted into a resin block 70B at respective positioning apertures 72 such that the terminals 52F of the socket components 18A are press-fitted into the corresponding positioning apertures 72 in the resin block 70B. Once the socket components 18A are thus pressed into the resin block 70B, the socket components 18A are held firmly therein and coming-off from the apertures 72 is effectively prevented by the click 74.

In any of the construction of FIGS. 23 and 24, the socket components 18A or 18H are held stably in the aligned state and a reliable electrical interconnection is achieved between the semiconductor devices 12A and the socket components thus held by the resin block 70A or 70B.

Next, the construction of a socket according to a fifteenth embodiment of the present invention will be described with reference to FIG. 26, FIGS. 27A–27C, FIG. 28 and FIG. 29.

As explained already, the memory semiconductor devices 12A mounted on the socket 14 to form the semiconductor module 10A are interconnected with each other electrically at the respective contact terminals 26A according to the property thereof, such that a contact terminal 26A of a semiconductor module 10A is connected by a socket component such as the socket component to the contact terminals 26A of other semiconductor modules 10A having the same property. By doing so, the interconnection pattern provided on the mother board of the computer in electrical connection with the socket 14 is simplified substantially.

On the other hand, it should be noted that not all the contact terminals 26A of the semiconductor devices 12A can be connected with each other by the socket components. For example, each of the semiconductor devices 12A includes a specific contact terminal 26A to which a selection signal of the semiconductor device 12A is supplied, while it is evident that such specific contact terminals 26A cannot be interconnected with each other.

Thus, the socket of the present embodiment is constructed such that the interconnection part 44A is provided only on the part of the socket component main body corresponding to the contact terminal 26A to which the selection signal is to be supplied. Thereby, the interconnection part 44A is not provided at the corresponding locations of other semiconductor devices 12A.

Figure 26:
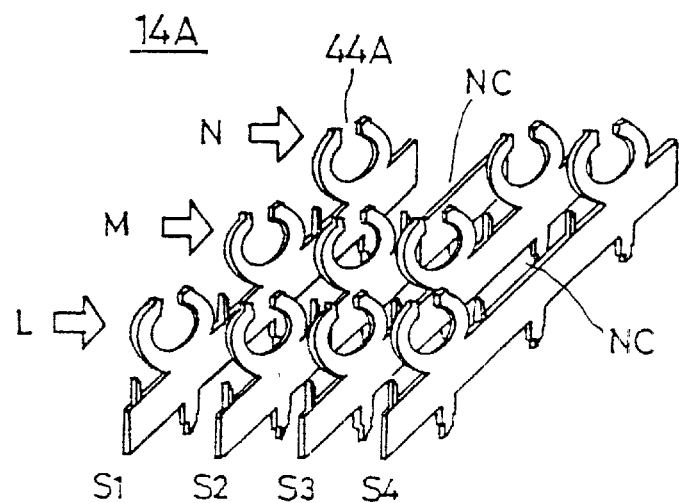
FIG. 26 is a diagram showing the construction of a socket according to a fifteenth embodiment of the present invention.

FIG. 26 shows the construction of a socket 14A according to the present embodiment.

Referring to FIG. 26, it should be noted that the socket 14A includes socket components $S_1$–$S_4$ arranged so as to hold semiconductor devices L, M and N on the interconnection parts 44A provided thereon similarly to the socket 14, except that the socket component $S_2$ includes a site NC in correspondence to the third semiconductor device N, on which no interconnection part 44A is provided. Similarly, the socket component $S_3$ includes a similar site NC in correspondence to the second semiconductor device M, on which no interconnection part 44A is provided.

Figure 27A:
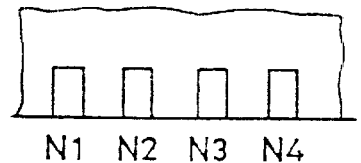
FIGS. 27A–27C are diagrams showing the semiconductor devices used in the fifteenth embodiment of the present invention.
Figure 27B:
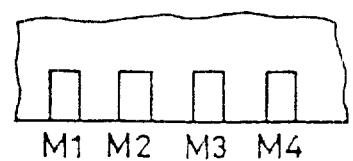
Figure 27C:
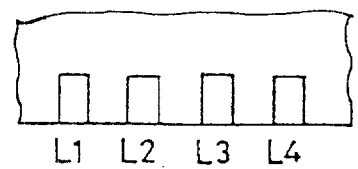

FIGS. 27A–27C show contact terminals provided on the semiconductor devices L, M and N respectively in an enlarged scale, wherein it can be seen that the first semiconductor device N includes contact terminals $N_1$–$N_4$, the second semiconductor device M includes contact terminals $M_1$–$M_4$, and the third semiconductor device L includes contact terminals $L_1$–$L_4$, wherein the terminals $N_1$, $M_1$ and $L_1$ have the same property. Similarly, the terminals $M_2$ and $L_2$ have the same property. On the other hand, the terminal $N_2$ of the semiconductor device N is used for a selection signal selecting the semiconductor device N.

Similarly, the terminals $N_3$–$L_3$ have the same property and can be used simultaneously, while the terminal $M_4$ of the semiconductor device M is used for a selection signal selecting the semiconductor device M. The terminals $N_4$ and $L_4$ have the same property and can be used simultaneously.

In correspondence to the foregoing properties of the terminals of the semiconductor devices L–M, the socket component $S_1$ forming the socket 14 includes the interconnection parts 44A in correspondence to all of the contact terminals $N_1$–$L_1$, while the socket component $S_2$ lacks the interconnection part 44A for the contact terminal $N_2$. Thus, the socket component $S_2$ carries the interconnection parts 44A only in correspondence to the contact terminals $M_2$ and $L_2$.

Further, the socket component $S_3$ includes the interconnection parts 44A for all of the contact terminals $N_3$–$L_3$, while the socket component $S_4$ includes the interconnection parts 44A only for the contact terminals $N_4$ and $L_4$. No interconnection part 44A is provided in correspondence to the contact terminal $M_4$.

Thus, when the semiconductor devices L–N are mounted on the socket 14A of FIG. 26, the problem of simultaneous selection of all of the semiconductor devices L–N is effectively eliminated. Further, it should be noted that the socket 14A of FIG. 26 is not only effective for selective interruption of signals to the semiconductor devices but also for a selective supplying of a selection signal to a selected semiconductor device by providing a single interconnection part 44A on a specific socket component.

It should be noted that the socket components $S_1$–$S_4$ of FIG. 26 can be easily formed by cutting a specific interconnection part 44A from the main body of the socket component.

Figure 28:
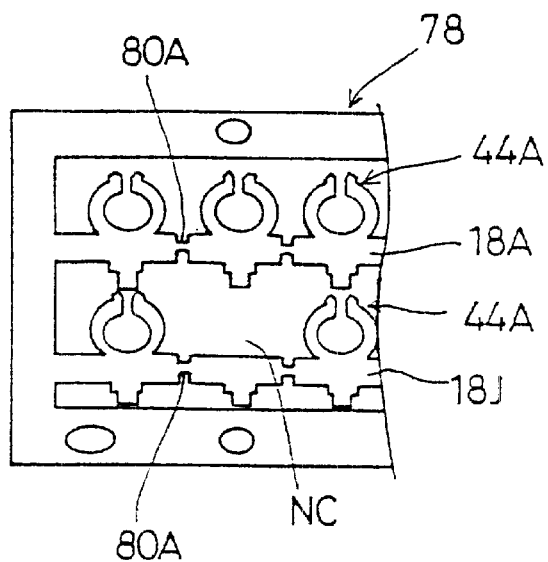
FIG. 28 is a diagram showing a fabrication process of the socket of the fifteenth embodiment.

FIG. 28 shows a fabrication process of the socket component forming the socket 14A of the present embodiment.

Referring to FIG. 28, a plurality of socket components such as the socket component 18A and a further socket component 18J are punched out from a lead frame 78, wherein it should be noted that the socket component 18J is formed such that no interconnection part 44A is formed at the site NC at the time of the punching process.

Figure 29:
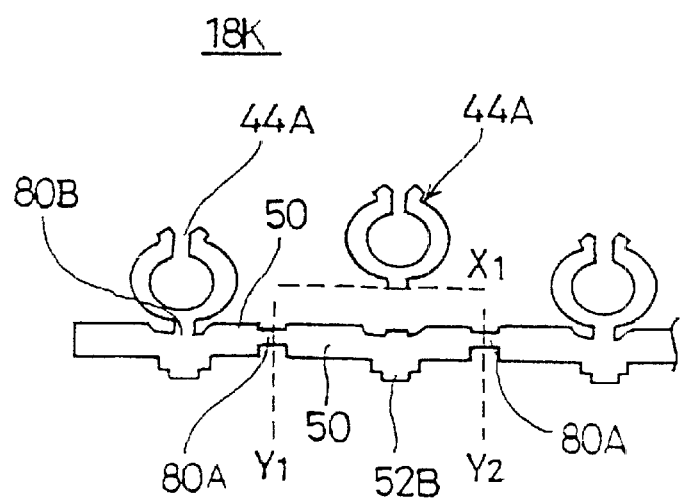
FIG. 29 is another diagram showing a fabrication process of the socket of the fifteenth embodiment.

In the example of FIG. 29 showing another process of forming a socket component 18K for use in the socket 18A of FIG. 26, it should be noted that the socket component 18K includes a reduced-with part 80B between the interconnection part 44A and the main body 50 for facilitating the cutting of the interconnection part 44A away from the main body 50 as indicated by a broken line $X_1$. Further, the main body 50 itself is formed with a reduced-with part 80A for facilitating the part of the main body 50 that includes an interconnection part 44A to be removed by a cutting process conducted along the broken lines $Y_1$ and $Y_2$ shown in FIG. 29. It should be noted that a similar reduced-width part 80A is formed also in the socket components 18A and 18J of FIG. 28.

Next, a socket according to a sixteenth embodiment of the present invention will be described with reference to FIG. 30.

Figure 30:
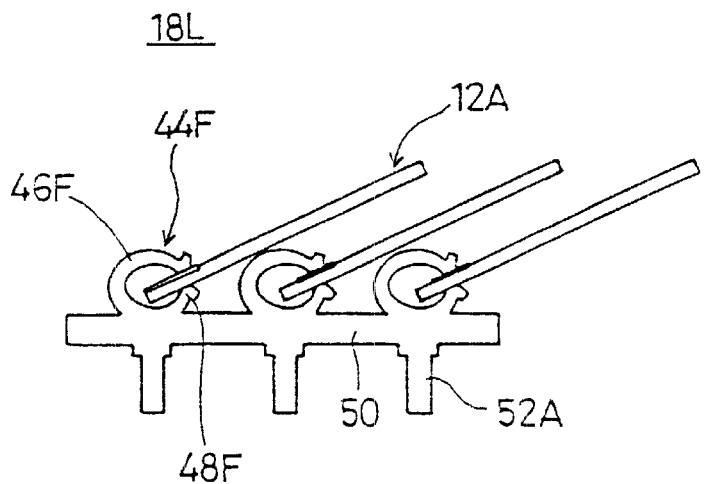
FIG. 30 is a diagram showing the construction of a socket according to a sixteenth embodiment of the present invention.

Referring to FIG. 30, the socket of the present embodiment includes socket components 18L each holds a semiconductor device 12A in an oblique state with respect to the mounting substrate on which the socket is mounted. More specifically, the socket component 18L of FIG. 30 includes a plurality of interconnection parts 44F each in turn includes first and second, arc-shaped contact members 46F and 48F such that the first contact member 46F has a longer arc length as compared with the second contact member 48F. Thus, the first and second contact members 46F and 48F form a gap for accepting the semiconductor device 12A at a location laterally offset from the gap formed in the socket member 18A of the previous embodiment, and the semiconductor device 12A thus accepted into the gap between the first and second contact members 46F and 48F are held obliquely with respect to the mother board of the computer on which the socket of the present embodiment is provided.

As a result of such an oblique mounting of the semiconductor devices 12A, the height of the semiconductor module is reduced substantially. Thus, the socket of the present embodiment is particularly useful in compact personal computers such as laptop or palm-top computers.

Figure 31:
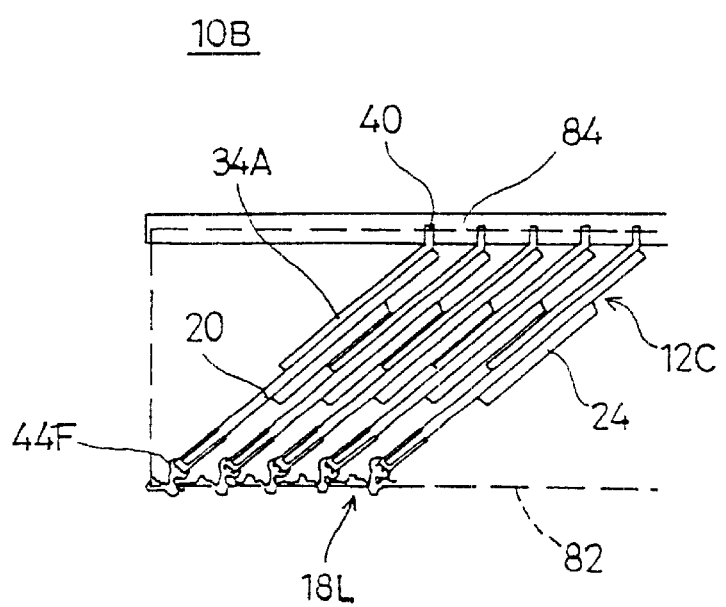
FIG. 31 is a diagram showing the construction of a semiconductor module according to the sixteenth embodiment of the present invention.

FIG. 31 shows the construction of a semiconductor module 31B that uses the socket of the sixteenth embodiment of the present invention.

Referring to FIG. 31, it can be seen that the socket components 18L forming the socket are provided at a bottom of a rectangular-shaped socket frame member 82, and semiconductor devices 12C are mounted on the socket components 18L obliquely with respect to the bottom surface of the socket frame member 82.

Further, it should be noted that the semiconductor device 12C carries a heat sink plate 34A on the circuit substrate 20 at the side opposite to the side on which the semiconductor chip 24 is mounted, wherein the heat sink plate 34A extends in the upward direction beyond the circuit substrate 20 to form an extension part 40. Further, the extension part 40 thus formed engages a corresponding hole or depression (not shown) provided on a heat sink member 84 that is provided at the top part of the socket frame member 82. As a result of the construction of FIG. 31, the total area of the heat sink structure including the heat sink plate 34A and the heat sink member 84 is increased and the efficiency of cooling is improved substantially.

In the semiconductor module of any of the preceding embodiments, it should be noted that the socket members such as e socket members 18A aligned to form a socket such as the socket 14, are either disposed with a mutual spatial separation or with a mutual separation by a resin forming a resin block such as the resin block 70A or 70B. However, it is also possible to dispose a lead frame plate 86 between adjacent socket members such as the socket members 18A in a state that the lead frame plate 86 is covered by an adhesive layer 88 as indicated in FIG. 32 that shows a seventeenth embodiment of the present invention.

Figure 32:
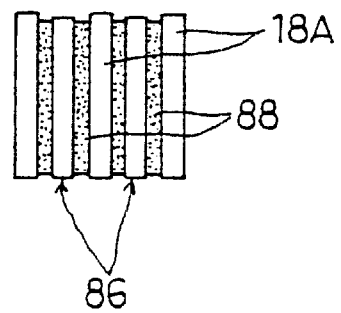
FIG. 32 is a diagram showing the construction of a socket according to a seventeenth embodiment of the present invention.

Referring to FIG. 32, it can be seen that a conductive lead frame plate 86 is disposed between a pair of the socket members 18A, with an adhesive layer formed at both sides of the lead frame plate 86 for insulating the same from the adjacent socket members 18A. The lead frame plate 86 thus formed may be used as a part of the electrical system of the semiconductor module by connecting the lead frame plate 86 to the ground (GND) or to a power source (VDD).

Next, the construction of a socket according to an eighteenth embodiment of the present invention will be described with reference to FIG. 33.

Figure 33:
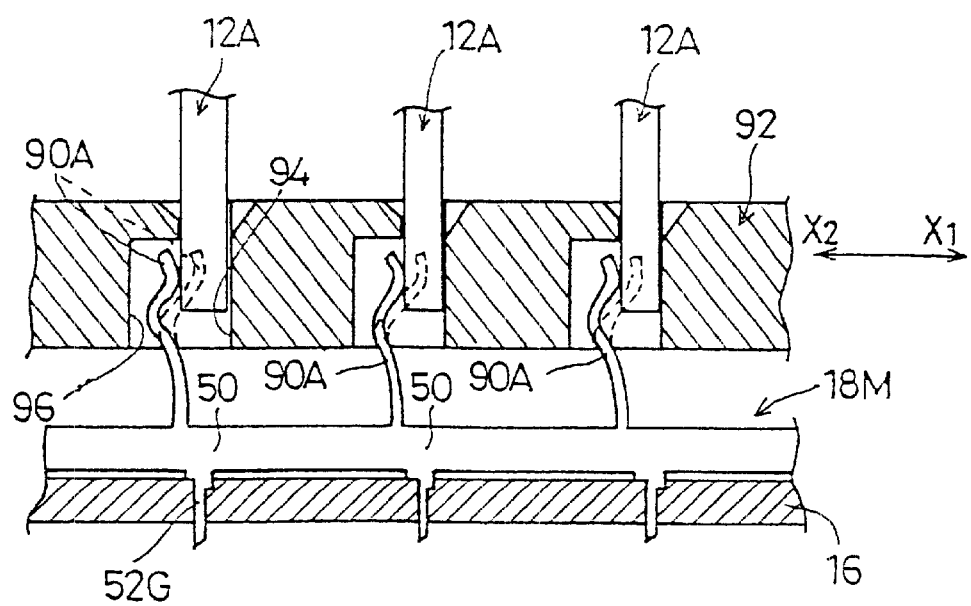
FIG. 33 is a diagram showing the construction of a socket according to an eighteenth embodiment of the present invention.

Referring to FIG. 33 showing a socket member 18M used for the socket of the present embodiment, it can be seen that the socket member 18M carries a plurality of contact pins 90A such that the contact pins 90A engage with corresponding contact terminals 26A on the semiconductor device 12A from a first side thereof. Similarly as before, each of the contact pins 90A is connected to the main body 50 electrically and mechanically. Further, the socket of the present embodiment includes a housing 92 used for mounting the semiconductor device 12A thereon.

The housing 92 is typically formed of an insulating resin and is fixed upon a mounting substrate 16 such as the mother board of a computer. The housing 92 is formed with a number of insertion slot 94 for accepting the semiconductor devices 12A and the semiconductor devices 12A thus inserted into the slot 94 are held in a substantially vertical state by the housing 93. Further, the housing 92 includes a plurality of spaces each in correspondence to a slot 94 for accommodating therein the contact pins 90A movably therein.

In the present embodiment, the socket is formed by a number of the socket components 18M provided on the mounting substrate 16 side by side, wherein it should be noted that the main body 50 of the socket components 18M carries a plurality of terminals 52G extending from the main body 50 in the downward direction for engagement with corresponding accepting holes provided on the mounting substrate 16.

It should be noted that the contact pins 90A are in a position represented in FIG. 33 by a broken line when there is no semiconductor device mounted upon the housing 92 forming the socket of the present embodiment, while the contact pins 90A are displaced by the edge of the semiconductor device 12A resiliently when the semiconductor device 12A is inserted into the slot 94 of the housing 92 and the contact pins 90A thus displaced engage the corresponding contact terminals 26A of the semiconductor device 12A laterally with a resilient urging force. When the semiconductor device 12A is removed from the slot 94, the contact pins 90A return to the state shown by the broken line.

In the present embodiment, the housing 92 holds a number of the semiconductor devices 12A in a substantially upright state and the density of mounting of the semiconductor devices 12A on the housing 92, and hence on the socket, is increased substantially. As the housing 92 holds the semiconductor devices 12A in a detachable state, the semiconductor devices 12A can be added or removed as desired on and from the housing 92, and the user of a computer can easily change the memory size thereof by applying the semiconductor module of the present embodiment to the computer.

Next, a nineteenth embodiment of the present invention will be described with reference to FIG. 34.

Figure 34:
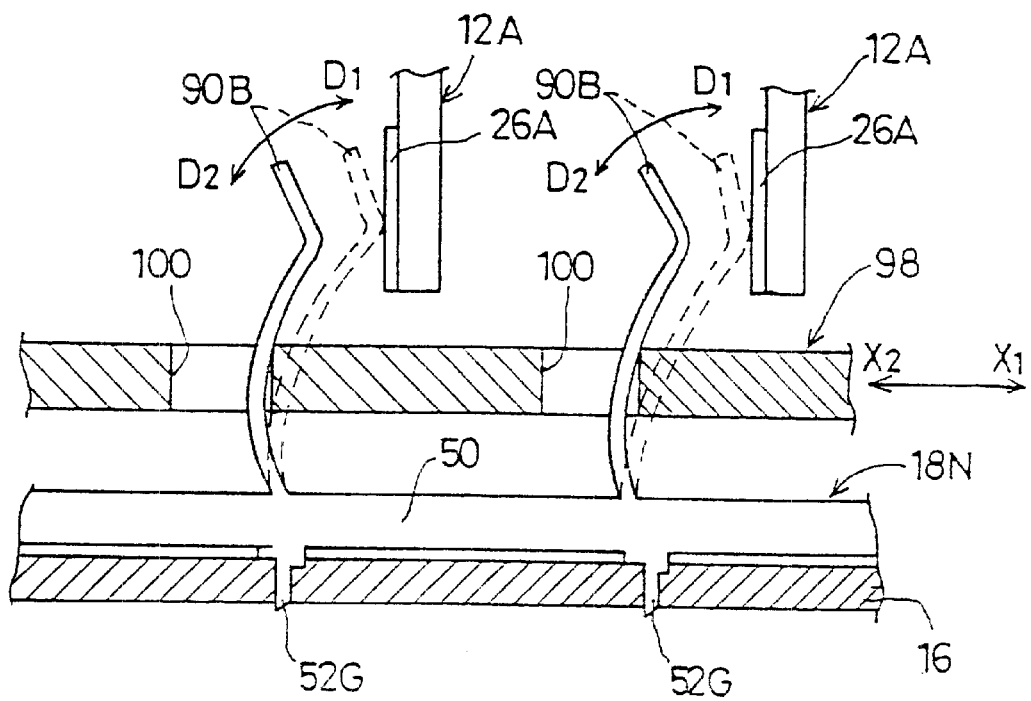
FIG. 34 is a diagram showing the construction of a socket according to a nineteenth embodiment of the present invention.

Referring to FIG. 34, the socket of the present embodiment uses a socket component 18N that includes contact pins 90B connected to the main body 50 electrically and mechanically similarly to the contact pins 90A of FIG. 33, wherein the contact pins 90B engage the semiconductor device 12A from a first side thereof when the semiconductor devices 12A are mounted on the socket. Further, the socket of the present embodiment uses an intermediate plate 98 for connecting the semiconductor devices 12A and the contact pins 90B electrically.

It should be noted that the intermediate plate 98 is formed of an insulating resin and is provided movably on the mount substrate 16 in a direction indicated by arrows $X_1$ and $X_2$. The intermediate plate 98 is formed with openings 100 respectively in correspondence to the contact pins 90B, and each of the contact pins 90B extends from a corresponding opening 100.

In the socket of the present embodiment, the socket members 18N are disposed on the mount substrate 16 in plural numbers, wherein each of the socket members 18N includes a plurality of terminals 52G on the main body 50 such that the terminals 52G extend in the downward direction from the main body 50.

In the state that the semiconductor devices 12A are not inserted into the socket, it should be noted that the contact pins 90B are urged in a direction $D_2$ to a position indicated in FIG. 34 by continuous lines by the intermediate plate 98, wherein it should be noted that the contact pins 90B have a resiliency to return spontaneously to the natural or free state shown in FIG. 34 by broken lines. Thereby, the intermediate plate 98 restricts the movement of the contact pins 90B in the direction D1 to return to the free state.

When the semiconductor devices 12A are mounted by a holding mechanism not illustrated, the intermediate plate 98 is moved in the direction $X_1$ and the restriction of the contact pins 90B explained above is eliminated. Thereby, the contact pins 90B return toward the free state as indicated by the broken lines and achieve an electrical contact with the corresponding contact terminals 26A on the semiconductor device 12A. Further, when the intermediate plate 98 is moved in the direction $X_2$, the intermediate plate 98 urges the contact pins 90B in the direction $D_2$ and the electrical contact with the semiconductor devices 12A is lost. By moving the intermediate plate 98 back and forth in the direction $X_1$ and in the direction $X_2$, it is possible to connect and disconnect the electrical interconnection between the semiconductor devices 12A and the socket.

Next, the construction of a socket according to a twentieth embodiment of the present invention will be described with referent to FIGS. 35A and 35B.

Figure 35A:
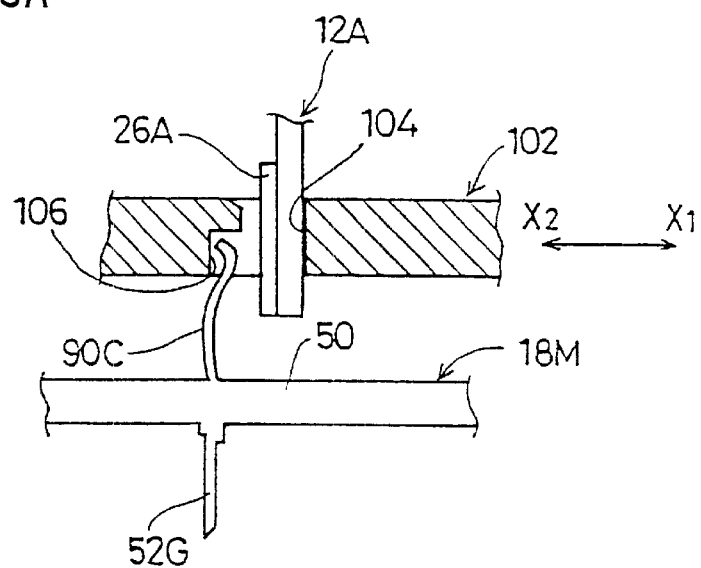
FIGS. 35A and 35B are diagrams showing the construction of a socket according to a twentieth embodiment of the present invention.
Figure 35B:
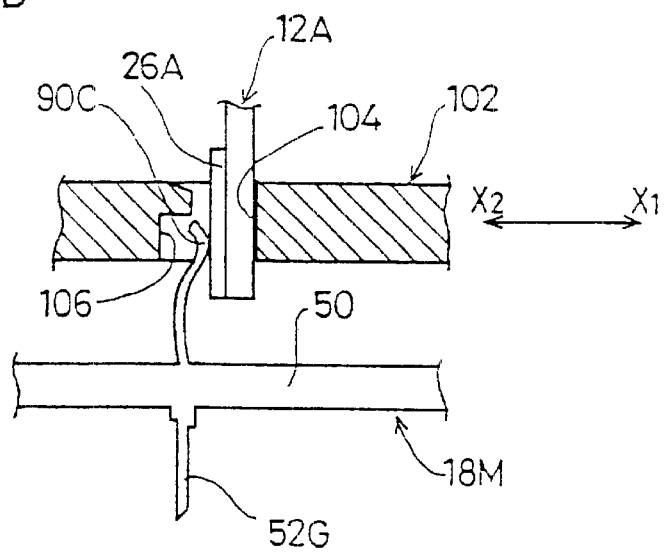

Referring to FIGS. 35A and 35B, the socket has a substantially identical construction to the socket 18M described with reference to FIG. 33. In FIGS. 35A and 35B, the illustration of the mount substrate 16 is omitted for the sake of simplicity.

It should be noted that the socket of the present invention includes a movable plate 102 that causes the semiconductor devices 12A to move in the $X_1$ and $X_2$ directions with respect to the socket component 18M, wherein the movable plate 102 is formed with an insertion slot 104 for accepting a semiconductor device 12A and a depression 106 for accommodating a contact pin 90C provided on the socket component 18M.

FIG. 35A shows the state immediately after a semiconductor device 12A is inserted to the slot 104 of the movable plate 102. As can be seen in FIG. 35A, the movable plate 102 is displaced in the direction $X_1$ and the contact pins 90C are separated from the semiconductor device 12A. No electrical contact is made between the contact terminals 26A on the semiconductor device 12A and the contact pins 90C.

After the foregoing insertion of the semiconductor device 12A into the slot 104, the movable plate 102 is moved in the direction $X_2$. As a result of the movement of the plate 102, the semiconductor device 12A thereon is also moved and the contact terminals 26A on the semiconductor device 12A are engaged with the corresponding contact pins 90C. Thereby, there is achieved an electrical interconnection between the semiconductor device 12A and the contact pins 90C.

When removing the semiconductor device 12A from the socket, the foregoing procedure is achieved in the reversed order.

According to the present embodiment, in which the semiconductor device is thus moved together with the movable plate 102, the semiconductor device 102 is forcedly urged against the contact pins 90C in the contact state and a reliable electrical contact is guaranteed for the semiconductor device 12A. Further, by moving the movable plate 102 in the opposite direction when removing the semiconductor device 12A, a reliable disconnection is achieved for the semiconductor device 12A.

In the description heretofore, it should be noted that there can be various combinations of the sockets (and hence the socket components) and the semiconductor devices. For example, any of the socket components 18A–18N may be used in combination with any of the semiconductor devices 12A–12D for effecting the change of memory size of the information processing apparatus such as a personal computer.

Further, the present invention is not limited to the embodiments described heretofore, but various variations and modifications may be made without departing form the scope of the invention.

What is claimed is:

1. A semiconductor module, comprising:

a plurality of semiconductor devices each including: a substrate carrying a single semiconductor chip thereon; an interconnection pattern provided on said substrate; and a plurality of contacts provided on an edge of said substrate in electrical connection with said interconnection pattern; and a socket holding said plurality of semiconductor devices detachably, said socket engaging said plurality of contacts of said plurality of semiconductor devices detachably, said socket comprising a plurality of conductive members each holding said plurality of semiconductor devices thereon at respective contacts that are pertinent to said conductive member.

2. A semiconductor module as claimed in claim 1, wherein, in each of said plurality of semiconductor devices, said semiconductor chip is a memory semiconductor chip.

3. A semiconductor module as claimed in claim 1, wherein, in each of said plurality of semiconductor devices, said plurality of contacts are provided on at least one of a principal surface of said substrate carrying thereon said single semiconductor chip, a rear surface of said substrate opposite to said principal surface and an edge surface corresponding to said edge of said substrate, said edge surface connecting said principal surface and said rear surface.

4. A semiconductor module comprising:

a plurality of semiconductor devices each including: a substrate carrying a single semiconductor chip thereon; an interconnection pattern provided on said substrate; and a plurality of contacts provided on an edge of said substrate in electrical connection with said interconnection pattern; and a socket holding said plurality of semiconductor devices detachably, said socket engaging said plurality of contacts of said plurality of semiconductor devices detachably, wherein, in each of said plurality of semiconductor devices, said plurality of contacts are provided on both of a principal surface of said substrate carrying thereon said semiconductor chip and a rear surface opposite to said principal surface, such that those contacts on said principal surface are displaced with respect to those contacts on said rear surface when viewed perpendicularly to said principal surface.

5. A semiconductor module comprising:

a plurality of semiconductor devices each including: a substrate carrying a single semiconductor chip thereon; an interconnection pattern provided on said substrate; and a plurality of contacts provided on an edge of said substrate in electrical connection with said interconnection pattern; and a socket holding said plurality of semiconductor devices detachably, said socket engaging said plurality of contacts of said plurality of semiconductor devices detachably, wherein, in each of said plurality of semiconductor devices, each of said contacts is provided with a depression.

6. A semiconductor module comprising:

a plurality of semiconductor devices each including: a substrate carrying a single semiconductor chip thereon; an interconnection pattern provided on said substrate; and a plurality of contacts provided on an edge of said substrate in electrical connection with said interconnection pattern; and a socket holding said plurality of semiconductor devices detachably, said socket engaging said plurality of contacts of said plurality of semiconductor devices detachably, wherein, in each of said plurality of semiconductor devices, said substrate carries a heat sink on a rear surface of said substrate opposite to a surface that carries thereon said semiconductor chip, said heat sink having an area equal to or larger than an area of said semiconductor chip.

7. A semiconductor module comprising:

a plurality of semiconductor devices each including: a substrate carrying a single semiconductor chip thereon; an interconnection pattern provided on said substrate; and a plurality of contacts provided on an edge of said substrate in electrical connection with said interconnection pattern; and a socket holding said plurality of semiconductor devices detachably, said socket engaging said plurality of contacts of said plurality of semiconductor devices detachably, wherein, in each of said plurality of semiconductor devices, said substrate carries a heat sink on a rear surface of said substrate opposite to a surface that carries thereon said semiconductor chip, said heat sink having an area equal to or larger than an area of said semiconductor chip, said heat sink forms an extension part extending beyond an edge of said substrate different from said edge on which said plurality of contacts are provided.

8. A semiconductor device as claimed in claim 1, wherein each of said plurality of semiconductor devices, said substrate includes a positioning part for positioning said substrate with respect to said socket.

9. A semiconductor device as claimed in claim 1, wherein, in each of said plurality of semiconductor devices, said semiconductor chip is mounted on said substrate by either of a wire bonding process, a flip-chip bonding process and a tape automated bonding process.

10. A semiconductor module, comprising:

a plurality of semiconductor devices each comprising: a substrate carrying a single semiconductor chip thereon; an interconnection pattern provided on said substrate in electrical connection with said semiconductor chip; and a plurality of contacts provided on an edge of said substrate in electrical connection with said interconnection pattern; and a socket for holding said plurality of semiconductor devices detachably, said socket comprising: a socket main body; a plurality of contacts provided on socket main body, said plurality of contacts being adapted for engagement with said plurality of contacts provided on each of said plurality of semiconductor devices mechanically, said plurality of contacts on said socket main body establishing an electrical contact with said corresponding contacts of said plurality of semiconductor devices and holding said contacts of said plurality of semiconductor devices detachably; and a plurality of terminals provided on said socket main body in electrical connection with said contacts on said socket main body.

* * * * *